United States Patent
Ishizaka et al.

(10) Patent No.: US 8,399,353 B2
(45) Date of Patent: Mar. 19, 2013

(54) METHODS OF FORMING COPPER WIRING AND COPPER FILM, AND FILM FORMING SYSTEM

(75) Inventors: Tadahiro Ishizaka, Yamanashi (JP); Atsushi Gomi, Yamanashi (JP); Takara Kato, Yamanashi (JP); Osamu Yokoyama, Yamanashi (JP); Takashi Sakuma, Yamanashi (JP); Chiaki Yasumuro, Yamanashi (JP); Hiroyuki Toshima, Yamanashi (JP); Tatsuo Hatano, Yamanashi (JP); Yasushi Mizusawa, Yamanashi (JP); Masamichi Hara, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/081,172

(22) Filed: Apr. 6, 2011

(65) Prior Publication Data
US 2012/0196437 A1    Aug. 2, 2012

(30) Foreign Application Priority Data

Jan. 27, 2011  (JP) .................................. 2011-15663
Jan. 27, 2011  (JP) .................................. 2011-15664

(51) Int. Cl.
*H01L 21/768* (2006.01)
(52) U.S. Cl. ............................... 438/653; 257/E21.584
(58) Field of Classification Search .................. 438/653; 257/E21.584
See application file for complete search history.

(56) References Cited

U.S. PATENT DOCUMENTS

| | | | |
|---|---|---|---|
| 6,627,542 B1 * | 9/2003 | Gandikota et al. | 438/654 |
| 6,797,620 B2 * | 9/2004 | Lewis et al. | 438/687 |
| 6,905,959 B1 * | 6/2005 | Ashtiani et al. | 438/648 |
| 7,211,509 B1 * | 5/2007 | Gopinath et al. | 438/650 |
| 7,265,038 B2 * | 9/2007 | Wu et al. | 438/513 |
| 7,482,269 B2 * | 1/2009 | Suzuki | 438/650 |
| 7,745,332 B1 * | 6/2010 | Shaviv et al. | 438/679 |
| 7,964,506 B1 * | 6/2011 | Ponnuswamy et al. | 438/687 |
| 8,017,523 B1 * | 9/2011 | Wu et al. | 438/687 |
| 2001/0005056 A1 * | 6/2001 | Cohen | 257/751 |

(Continued)

FOREIGN PATENT DOCUMENTS

| | | | |
|---|---|---|---|
| JP | 2003-514126 A | 4/2003 | |
| JP | 2006-148075 A | 6/2006 | |

(Continued)

OTHER PUBLICATIONS

Ishizaka, Tadahiro et al., "Bottom up deposition of advanced iPVD Cu process integrated with iPVD Ti and CVD Ru", presented Oct. 5, 2010, https://www.sematech.org/8964.

*Primary Examiner* — Alexander Ghyka
*Assistant Examiner* — Stanetta Isaac
(74) *Attorney, Agent, or Firm* — Nath, Goldberg & Meyer; Jerald L. Meyer

(57) ABSTRACT

A method of forming a Cu wiring in a trench or hole formed in a substrate is provided. The method includes forming a barrier film on the surface of the trench or hole, forming a Ru film on the barrier film, and embedding copper in the trench or hole by forming a Cu film on the Ru film using PVD while heating the substrate such that migration of copper into the trench or hole occurs.

13 Claims, 26 Drawing Sheets

U.S. PATENT DOCUMENTS

| | | | |
|---|---|---|---|
| 2002/0041028 A1* | 4/2002 | Choi et al. | 257/751 |
| 2005/0181598 A1* | 8/2005 | Kailasam | 438/654 |
| 2006/0110918 A1* | 5/2006 | Suzuki | 438/674 |
| 2006/0220248 A1* | 10/2006 | Suzuki | 257/751 |
| 2007/0077683 A1 | 4/2007 | Cerio, Jr. | |
| 2007/0224793 A1 | 9/2007 | Cerio, Jr. | |
| 2008/0213994 A1* | 9/2008 | Chebiam et al. | 438/643 |
| 2009/0087982 A1* | 4/2009 | Wang et al. | 438/653 |
| 2010/0096756 A1* | 4/2010 | Tagami et al. | 257/762 |
| 2011/0163451 A1* | 7/2011 | Matsumoto et al. | 257/751 |

FOREIGN PATENT DOCUMENTS

| | | |
|---|---|---|
| JP | 2007-194624 A | 8/2007 |
| JP | 2007-214387 A | 8/2007 |
| JP | 2007-531271 A | 11/2007 |
| JP | 2009-105289 A | 5/2009 |

* cited by examiner

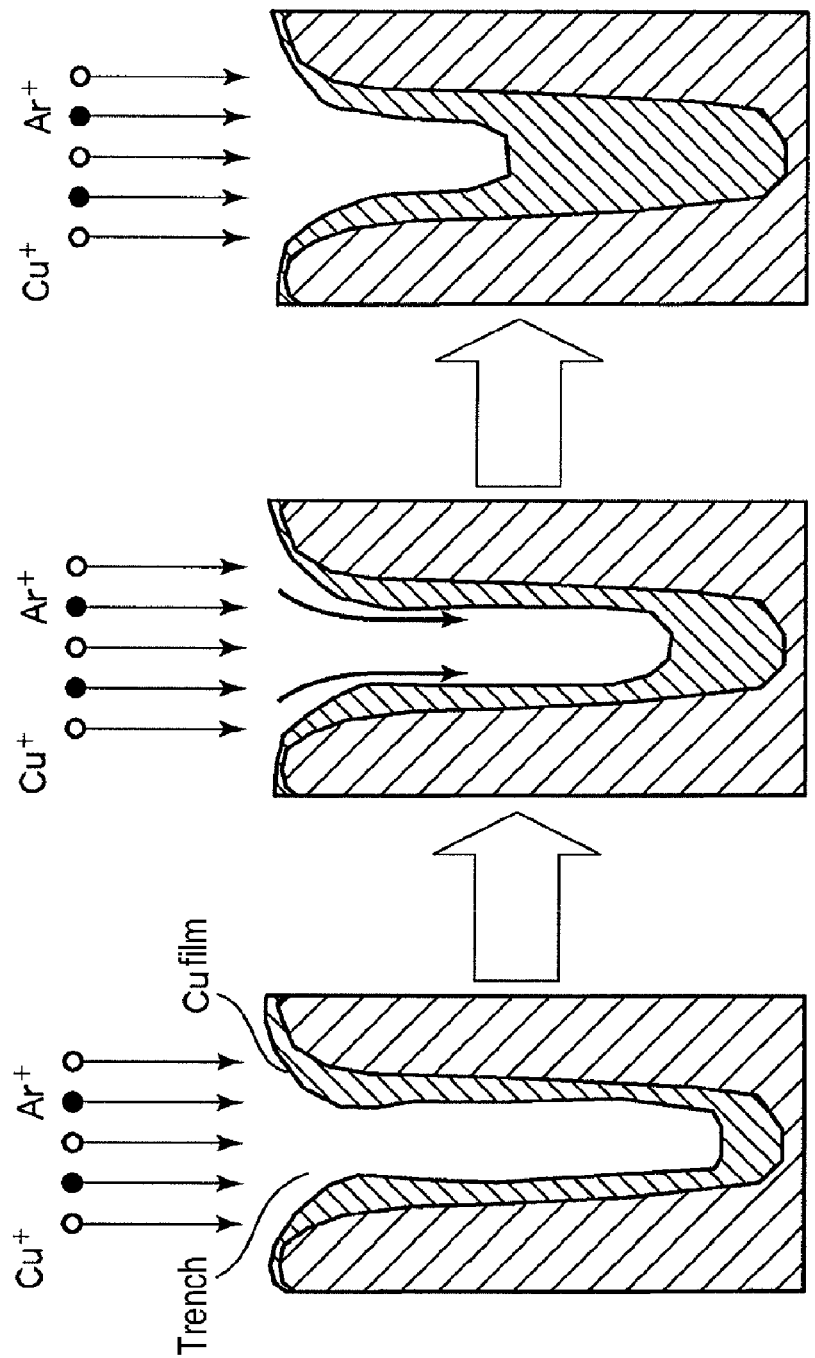

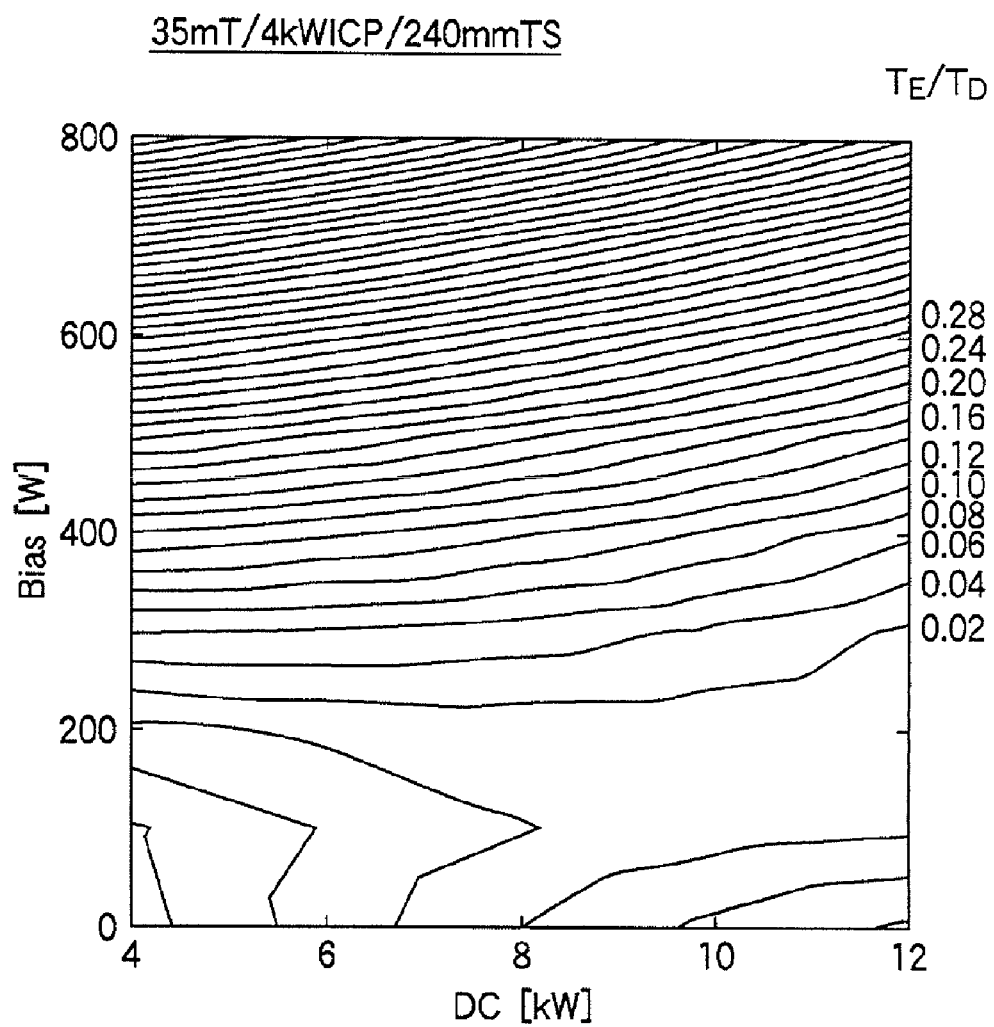

Bias power : 130W ($T_E/T_D=0$) 65°C

Bias power : 195W ($T_E/T_D=0.02$) 65°C

130W Bias ($T_E/T_D=0$)

FIG. 12B
FIG. 12C
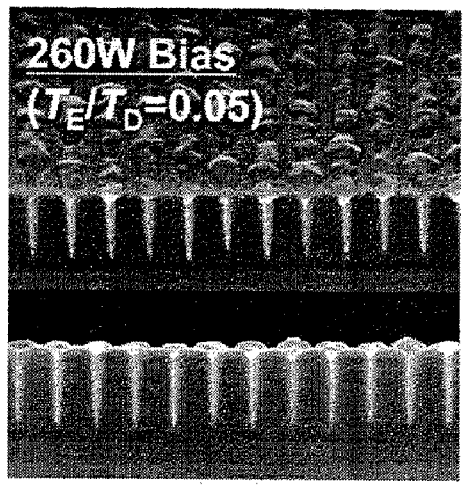
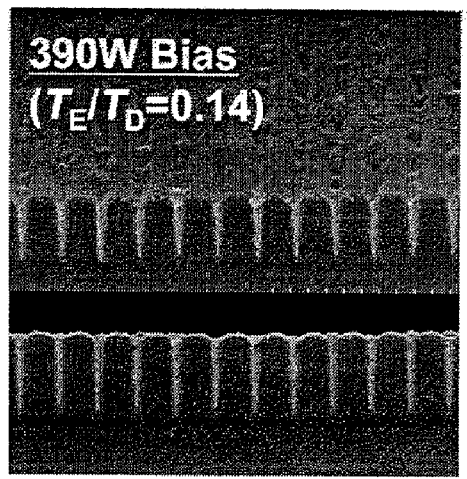

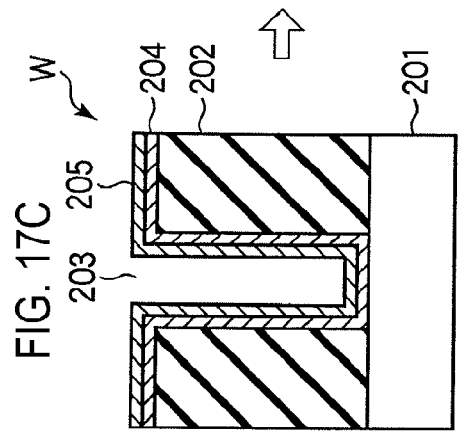
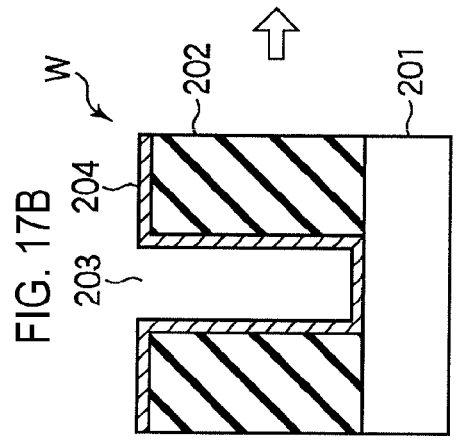
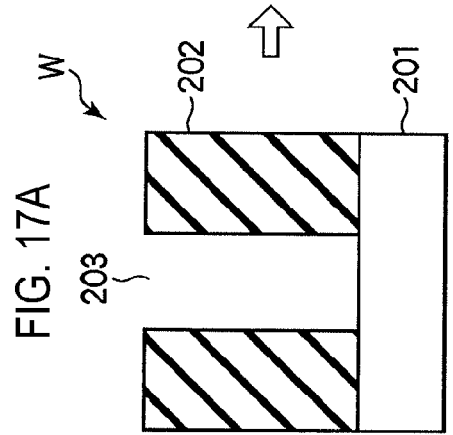
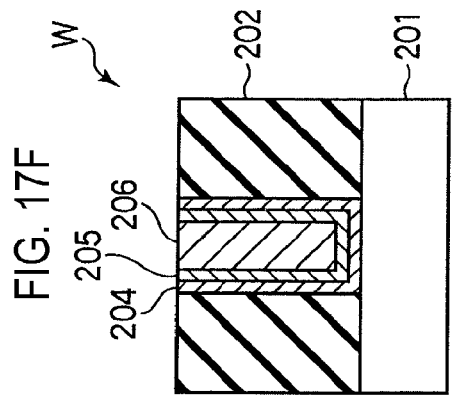
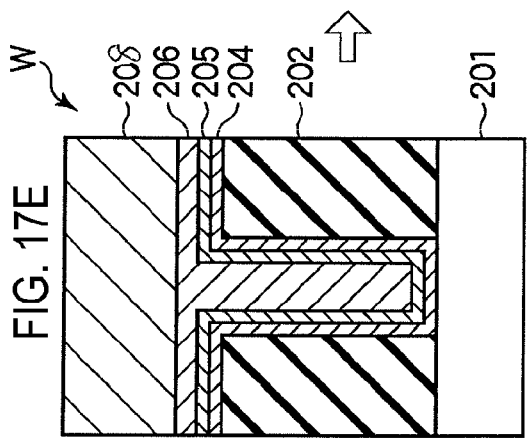
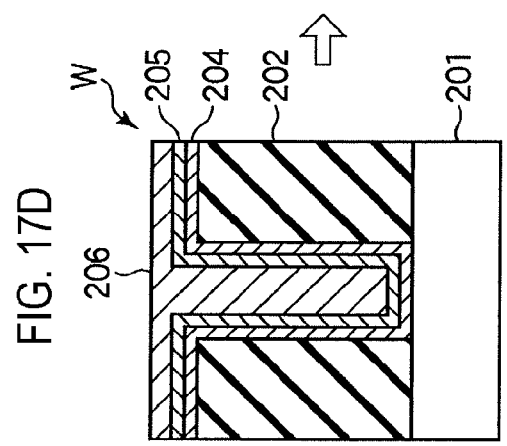

ced Patent Publication No. 2007-194624 has higher embedment

METHODS OF FORMING COPPER WIRING AND COPPER FILM, AND FILM FORMING SYSTEM

CROSS-REFERENCE TO RELATED APPLICATIONS

This application is based upon and claims the benefit of priority from Japanese Patent Application Nos. 2011-015663, filed on Jan. 27, 2011; and 2011-015664, filed on Jan. 27, 2011, the entire contents of which are incorporated herein by reference.

TECHNICAL FIELD

The present disclosure relates to a method of forming a copper wiring in a trench or a hole formed in a substrate, and a method and system for forming a copper film for forming the copper wiring.

BACKGROUND

Semiconductor devices are manufactured by repeatedly performing a variety of processes such as a film-forming process, an etching process, etc. on a semiconductor wafer. According to recent demands for high speed of a semiconductor device, miniaturization of a wiring pattern, and high integration of a semiconductor device, a wiring requires an improvement in conductivity and resistance against electromigration.

In order to deal with this problem, copper that has both higher conductivity (lower resistance) and better resistance to electromigration than aluminum (Al) or tungsten (W) has been used for wirings.

A method of forming a copper wiring was proposed which includes forming a barrier film formed of tantalum (Ta), titanium (Ti), tantalum nitride (TaN), titanium nitride (TiN), or the like on the whole of an interlayer dielectric with a trench or a hole formed therein using a plasma sputtering as a PVD (Physical Vapor Deposition), forming a copper seed film on the barrier film using the plasma sputtering, plating a copper film on the copper seed film to completely embed the trench or hole, and removing the extra copper film on the surface of a wafer using chemical mechanical polishing (CMP) (e.g. Japanese Unexamined Patent Publication No. 2006-148075). Further, a technique of forming a copper film that has good adhesion and can be formed on a micro fine pattern was also proposed which includes forming a Ru film on the barrier film using CVD, forming a Cu seed film, and forming a Cu plating film (e.g. Japanese Unexamined Patent Publication No. 2007-194624).

However, as design rules of semiconductor devices are gradually made finer, a width of a trench or a diameter of a hole amounts to tens nm. When the barrier film or the seed film is formed in the trench or the hole using the plasma sputtering, an overhang is generated in the opening of the trench or hole, so that even during subsequent Cu plating, the trench or hole is not completely filled with Cu, thereby generating voids.

For improved embedment characteristic, Japanese Unexamined Patent Publication No. 2006-148075 tried to control a bias power supplied to a mounting stage of the plasma sputtering apparatus so as to regulate a film-forming rate and a sputtering-etching rate, or otherwise improve a Cu plating apparatus to increase embedment characteristic of Cu. Further, while the method disclosed in Japanese Unexamined Patent Publication No. 2007-194624 has higher embedment characteristic of Cu, it is difficult to adapt the method to a recently miniaturized trench or hole.

Further, since Cu plating has a great quantity of impurities, it cannot sufficiently deal with demand for lower resistance of a wiring.

Further, in case of using the plating, in addition to the PVD apparatus for forming the seed film, a plating apparatus is required, increasing both equipment costs and the number of processes, rendering the formation of the wiring complicated. Furthermore, since Cu plating has a large quantity of impurities, it cannot sufficiently deal with demand for lower resistance of a wiring. Thus, while it is expected that a Cu wiring is formed only using PVD without Cu plating, it is not as yet realized that a Cu wiring is formed in a narrow trench or hole in the magnitude of tens nm, only using PVD.

SUMMARY

The present disclosure provides some embodiments of a method of forming a Cu wiring with lower resistance in a fine trench or hole such that copper is completely embedded without generating voids, and a method and system for forming a Cu film for forming the Cu wiring.

Further, the present disclosure provides embodiments of a method of forming a Cu wiring by embedding copper in a fine trench or hole only using PVD without using Cu plating, and a system for forming a Cu film for forming the Cu wiring.

According to one embodiment of the present disclosure, a method of forming a Cu wiring in a trench or hole formed in a substrate is provided, the method including forming a barrier film on the surface of the trench or hole, forming a Ru film on the barrier film, and embedding copper in the trench or hole by forming a Cu film on the Ru film using PVD while heating the substrate such that migration of copper into the trench or hole occurs.

In the embodiment, the Cu film for embedment of Cu may be formed by generating plasma using plasma-generating gas in a process chamber in which the substrate is loaded, allowing Cu elements to be emitted from a Cu target, ionizing the Cu elements in the plasma into Cu ions, and applying a bias power to the substrate to cause the Cu ions to be attracted towards the substrate.

Here, the formation of the Cu film for embedment of Cu may be carried out at the temperature of the substrate ranging between 65° C. and 350° C.

Further, the formation of the Cu film may be carried out under a condition that the temperature of the substrate ranges between above 200° C. and up to 350° C., and the magnitude of the bias power is controlled such that a film-deposition amount ($T_D$) of the Cu ions on the substrate and an etched amount ($T_E$) of the Cu film by ions of the plasma-generating gas satisfy the correlation of $0 \leq T_E/T_D < 1$. In addition, the formation of the Cu film may be carried out under a condition that the temperature of the substrate ranges between 65° C. and 200° C., and the magnitude of the bias power is controlled such that a film-deposition amount ($T_D$) of the Cu ions on the substrate and an etched amount ($T_E$) of the Cu film by ions of the plasma-generating gas satisfy the correlation of $0.02 \leq T_E/T_D < 1$. In another embodiment, the magnitude of the bias power may be controlled such that it satisfies the correlation of $0.05 \leq T_E/T_D \leq 0.24$.

In the embodiment, the barrier film may be formed of a film selected from a group including a Ti film, a TiN film, a Ta film, a TaN film, a Ta/TaN film, a TaCN film, a W film, a WN film, a WCN film, a Zr film, a ZrN film, a V film, a VN film, a Nb film, and a NbN film. The barrier film may preferably be formed by PVD.

The Ru film may preferably be formed by CVD. In addition, the Ru film may more preferably be formed by CVD using ruthenium carbonyl as a film-forming material.

According to another embodiment of the present disclosure, a method of forming a Cu film on a predetermined film having a trench or hole formed in a substrate for embedment of Cu in the trench or hole through a barrier film and a Ru film is provided, the method including embedding Cu in the trench or hole by forming the Cu film on the Ru film using PVD while heating the substrate such that migration of Cu into the trench or hole occurs.

According to another embodiment of the present disclosure, a system for forming a Cu wiring by embedding Cu in a trench or hole formed in a substrate is provided, the system including a barrier film-forming unit forming a barrier film on the surface of the trench or hole, a Ru film-forming unit forming a Ru film on the barrier film, a Cu film-forming unit forming a Cu film on the Ru film using PVD, thereby embedding Cu in the trench or hole, and a control unit controlling the Cu film-forming unit to form the Cu film while heating the substrate such that migration of Cu occurs, thereby embedding Cu in the trench or hole.

The system may preferably further include a transfer unit carrying a target object among the barrier film-forming unit, the Ru film-forming unit, and the Cu film-forming unit while maintaining a vacuum state.

According to a further embodiment of the present disclosure, a memory medium operable in a computer is provided, the memory medium including a loadable program for controlling a film-forming system, wherein upon execution, the program executes a method of forming a Cu wiring in a trench or hole formed in a substrate by embedding Cu in the trench or hole, the method including at least forming a barrier film on the surface of the trench or hole, forming a Ru film on the barrier film, and embedding copper in the trench or hole by forming a Cu film on the Ru film using PVD while heating the substrate such that migration of copper into the trench or hole occurs.

According to a still further embodiment of the present disclosure, a method of forming a Cu wiring by embedding Cu in a trench or hole having a predetermined pattern formed in a substrate is provided, the method including at least forming a barrier film on the surface of the trench or hole, forming a Ru film on the barrier film, embedding Cu in the trench or hole by forming a first Cu film on the Ru film using PVD such that migration of copper into the trench or hole occurs, forming a second Cu film on a pattern including the first Cu film using PVD at a film-forming rate faster than that of the first Cu film, and performing chemical mechanical polishing (CMP) on the entire surface of the substrate.

The embodiment may preferably further include an annealing process between the process of forming the second Cu film and the CMP process.

The process of embedding Cu in the trench or hole by forming the first Cu film may preferably be performed by an apparatus generating plasma using plasma-generating gas in a process chamber in which the substrate is loaded, allowing Cu elements to be emitted from a Cu target, ionizing the Cu elements in the plasma into Cu ions, and applying a bias power to the substrate to cause the Cu ions to be attracted towards the substrate.

Here, the process of embedding Cu in the trench or hole by forming the first Cu film may preferably be carried out at the temperature of the substrate ranging between 65° C. and 350° C.

The process of forming the second Cu film may be carried out by the apparatus for forming the first Cu film under a condition that at least one of the pressure of the process chamber and the temperature of the substrate becomes lower than the condition when the first Cu film is formed.

The process of forming the second Cu film may be carried out by a different apparatus from the apparatus for forming the first Cu film. Here, the process of forming the second Cu film may be performed by an apparatus generating plasma using plasma-generating gas in a process chamber in which the substrate is loaded, allowing Cu elements to be emitted from a Cu target, ionizing the Cu elements in the plasma into Cu ions, and applying a bias power to the substrate to cause the Cu ions to be attracted towards the substrate under a condition that at least one of the pressure of the process chamber and the temperature of the substrate becomes lower than the condition of the apparatus for forming the first Cu film.

The first Cu film may be formed to fill the whole of the trench or hole, and the second Cu film may be formed as overburden on the first Cu film.

The pattern may have a relatively narrow trench or hole and a relatively wide trench or hole and be configured such that the first Cu film completely fills the relatively narrow trench or hole and partially fills the relatively wide trench or hole, and the second Cu film is formed as overburden on the first Cu film in the relatively narrow trench or hole and completely fills the relatively wide trench or hole, thereby further forming an overburdened portion.

The barrier film may be formed of a film selected from a group including a Ti film, a TiN film, a Ta film, a TaN film, a Ta/TaN film, a TaCN film, a W film, a WN film, a WCN film, a Zr film, a ZrN film, a V film, a VN film, a Nb film, and a NbN film. The barrier film may preferably be formed by PVD. The Ru film may preferably be formed by CVD. In addition, the Ru film may more preferably be formed by CVD using ruthenium carbonyl as a film-forming material.

According to a further embodiment of the present disclosure, a system for forming a Cu wiring by embedding Cu in a trench or hole having a predetermined pattern and formed in a substrate is provided, the system including at least a barrier film-forming unit forming a barrier film on the surface of the trench or hole, a Ru film-forming unit forming a Ru film on the barrier film, a Cu film-forming unit forming a Cu film on the Ru film using PVD, and a control unit controlling the Cu film-forming unit to form a first Cu film in the trench or hole such that migration of Cu occurs, thereby embedding Cu in the trench or hole, and to form a second Cu film on the pattern including the first Cu film at a film-forming rate faster than that of the first Cu film.

According to a further embodiment of the present disclosure, a system for forming a Cu wiring by embedding Cu in a trench or hole having a predetermined pattern and formed in a substrate is provided, the system including at least a barrier film-forming unit forming a barrier film on the surface of the trench or hole, a Ru film-forming unit forming a Ru film on the barrier film, a first Cu film-forming unit forming a first Cu film on the Ru film using PVD, a second Cu film-forming unit forming a second Cu film on the first Cu film using PVD, and a control unit controlling the first Cu film-forming unit to form the first Cu film in the trench or hole such that migration of Cu occurs on the Ru film by means of PVD, thereby embedding Cu in the trench or hole, and controlling the second Cu film-forming unit to form the second Cu film on the pattern including the first Cu film at a film-forming rate faster than that of the first Cu film by means of PVD.

BRIEF DESCRIPTION OF THE DRAWINGS

FIG. 7A to FIG. 7C are a schematic view explaining a film-forming model when the Cu film is formed by the Cu film-forming unit of FIG. 2, respectively.

FIGS. 8A and 8B are graphical diagrams showing values of $T_E/T_D$ in contour lines with respect to a horizontal axis of DC power supplied to a Cu target and a vertical axis of a bias power when a Cu film is actually formed under the process pressure of 90 mT and 35 mT using the Cu film-forming unit of FIG. 2.

FIGS. 12A to 12D are SEM photographs of Cu films formed under a condition that the bias power varies such that $T_E/T_D$ amounts to 0 to 0.24, the film-forming temperature is set to 250° C., and film-forming time is set to 56 secs.

FIG. 17A to 17F are a cross-sectional process view explaining the method of forming the Cu wiring according to the second embodiment, respectively.

DETAILED DESCRIPTION

Exemplary embodiments of the present disclosure will now be described with reference to the drawings.

1. First Embodiment

A first embodiment will be first described.
<Film-Forming System>

Figure 1:
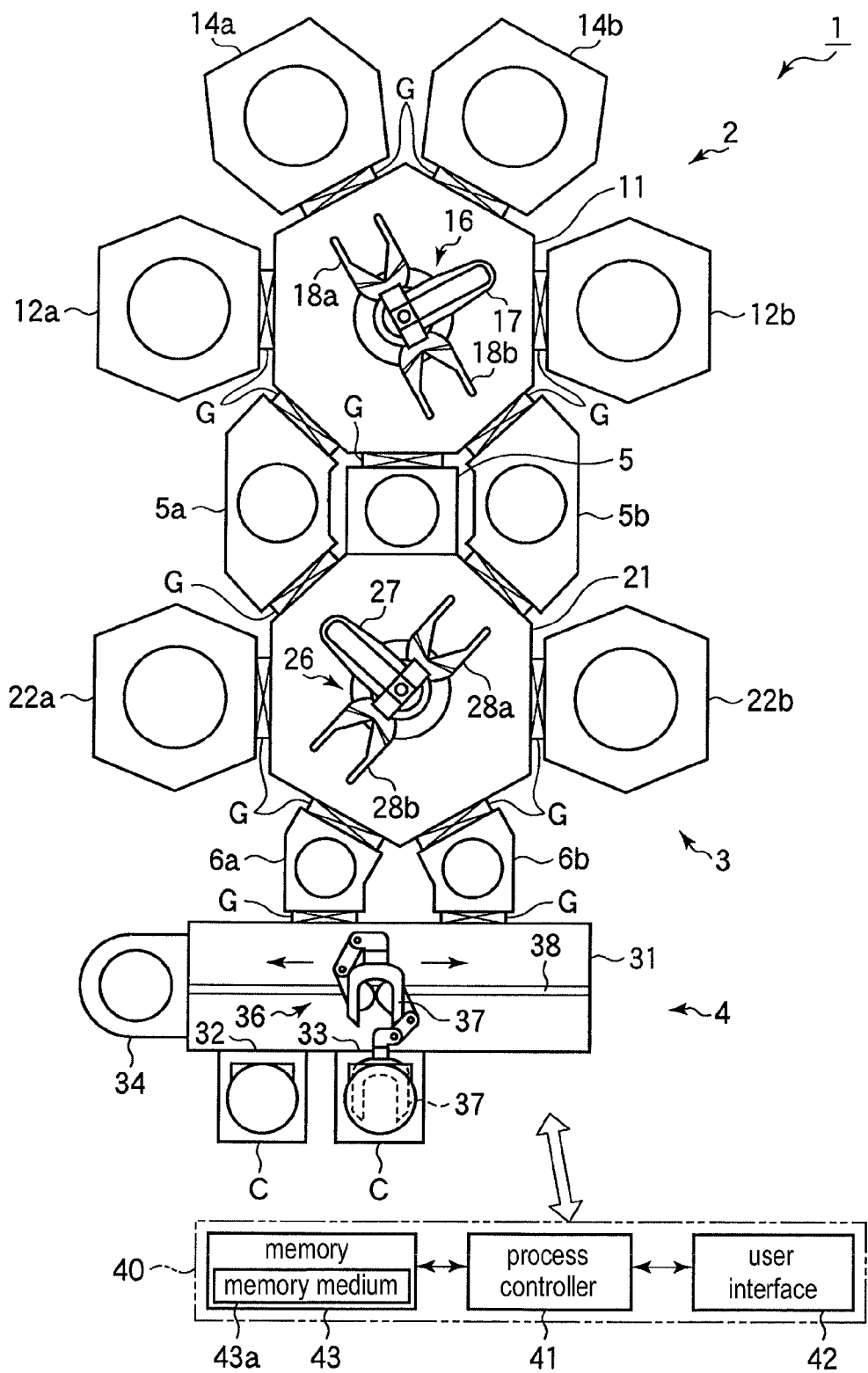
FIG. 1 is a plan view showing a multi-chamber type film-forming system for implementing a method of forming a Cu wiring according to a first embodiment of the present disclosure.

FIG. 1 is a plan view showing a multi-chamber type film-forming system for implementing a method of forming a Cu wiring according to a first embodiment of the present disclosure.

The film-forming system 1 includes a first processing section 2 for forming a barrier film and a Ru liner film, a second processing section 3 for forming a Cu film, and an inlet/outlet section 4 in order to form a Cu wiring on a semiconductor wafer W (hereinafter simply referred to as a 'wafer').

The first processing section 2 includes a first vacuumed transfer chamber 11 shaped like a heptagon in a plan view, and two barrier film-forming units 12a and 12b and two Ru liner film-forming units 14a and 14b which are connected to walls of four sides of the first vacuumed transfer chamber 11. The two sets of barrier film-forming unit and the Ru liner film-forming unit 12a and 14a; 12b and 14b each are arranged symmetric with respect to a line.

Degas chambers 5a and 5b are connected to two other walls of the sides of the first vacuumed transfer chamber 11 in order to degas the wafer W. A buffer chamber 5 is connected to the remaining wall of the sides of the first vacuumed transfer chamber 11 and between the degas chambers 5a and 5b connected to the first vacuumed transfer chamber 11 in order to transfer the wafer W between the first vacuumed transfer chamber 11 and a second vacuumed transfer chamber 21 to be described later.

The barrier film-forming units 12a and 12b, the Ru liner film-forming units 14a and 14b, the degas chambers 5a and 5b, and the buffer chamber 5 are connected to the respective sides of the first vacuumed transfer chamber 11 through gate valves G, so that they communicate with and are isolated from the first vacuumed transfer chamber 11 by opening and closing the gate valves G.

The first vacuumed transfer chamber 11 is maintained in a vacuum state and includes therein a first transfer mechanism 16 which performs loading and unloading of the wafer W in and out of the barrier film-forming units 12a and 12b, the Ru liner film-forming units 14a and 14b, the degas chambers 5a and 5b, and the buffer chamber 5. The first transfer mechanism 16 is arranged at substantially the center of the first vacuumed transfer chamber 11, and has a rotatable/extendible element 17 and two support arms 18a and 18b which are mounted oppositely on a leading end of the rotatable/extendible element 17 so as to hold the wafer W.

The second processing section 3 includes a second vacuumed transfer chamber 21 shaped like a heptagon in a plan view, and two Cu film-forming units 22a and 22b which are connected to walls of opposite sides of the second vacuumed transfer chamber 21.

The degas chambers 5a and 5b are respectively connected to walls of two sides of the second vacuumed transfer chamber 21 towards the first processing section 2, and the buffer chamber 5 is connected to a wall of a side of the second vacuumed transfer chamber 21 and between the degas chambers 5a and 5b. That is, all of the buffer chamber 5 and the degas chambers 5a and 5b are mounted between the first vacuumed transfer carrier chamber 11 and the second vacuumed transfer chamber 21 such that the degas chambers 5a and 5b are arranged on opposite sides of the buffer chamber 5. Air and vacuum transferable load lock chambers 6a and 6b are respectively connected to two sides of the second transfer chamber 21 towards the inlet/outlet section 4.

The Cu film-forming units 22a and 22b, the degas chambers 5a and 5b, and the load lock chambers 6a and 6b are connected to the respective sides of the second vacuumed transfer chamber 21 through gate valves G, so that they communicate with and are isolated from the second vacuumed transfer chamber 21 by opening and closing the gate valves G. In addition, the buffer chamber 5 is connected to the second transfer chamber 21 without using a gate valve.

The second vacuumed transfer chamber 21 is maintained in a vacuum state and includes therein a second transfer mechanism 26 which performs loading and unloading of the wafer W in and out of the Cu film-forming units 22a and 22b, the degas chambers 5a and 5b, and the load lock chambers 6a and 6b. The second transfer mechanism 26 is arranged at substantially the center of the second vacuumed transfer chamber 21, and has a rotatable/extendible element 27 and two support arms 28a and 28b which are mounted oppositely on a leading end of the rotatable/extendible element 27 so as to hold the wafer W.

The inlet/outlet section 4 is arranged opposite to the second processing section 3 with the load lock chambers 6a and 6b interposed therebetween, and has an atmosphere transfer chamber 31 to which the load lock chambers 6a and 6b are connected. Gate valves G are mounted between the load lock chambers 6a and 6b and the atmosphere transfer chamber 31. Two connection ports 32 and 33 are mounted on a wall of the atmosphere transfer chamber 31 opposite to the wall to which the load lock chambers 6a and 6b are connected, so as to connect carriers C in which the wafer W of a target substrate is received. Shutters (not shown) are mounted in the respective connection ports 32 and 33 to which wafer-stocked or empty carriers C are directly mounted. Here, the shutters are removed so that the connection ports communicate with the atmosphere transfer chamber 31 while preventing external introduction of air. An alignment chamber 34 is mounted to the side of the atmosphere transfer chamber 31 in order to align the wafer W. The atmosphere transfer chamber 31 includes therein a air-transfer mechanism 36 which performs loading/unloading of the wafer W with respect to the carriers C and the load lock chambers 6a and 6b. The atmosphere transfer mechanism 36 has two multi-joint arms having on respective leading ends a hand 37 which holds the wafer W. The atmosphere transfer mechanism 36 is movable along a rail 38 according to an arrangement direction of the carriers C in order to carry the wafer W using the hand 37.

The film-forming system 1 includes a control unit 40. The control unit 40 includes a process controller 41 consisting of a microprocessor (computer) which executes a control action on the respective units, a user interface 42 which consist of a keyboard through which commands are inputted for management of the film-forming system 1, a display which displays the operation status of the film-forming system 1, and the like, and a memory 43 in which a control program for implementing processes executed by the film-forming system 1 under the control of the process controller 41 or a program for executing processes on the respective units of the processing section according to a variety of data and process conditions, i.e. a recipe, is stored. The user interface 42 and the memory 43 are connected to the process controller 41.

The recipe is stored in a memory medium 43a of the memory 43. The memory medium 43a may include a hard disk or a transferable memory medium such as CDROMs, DVDs, flash memories, etc. Further, the recipe may be properly transmitted from other apparatus via a dedicated line, for example.

Moreover, if needed, an arbitrary recipe is unloaded from the memory 43 by instructions or the like from the user interface 42 so as to execute the process controller 41, thereby probably performing desired processes of the film-forming system 1 under the control of the process controller 41.

In the film-forming system 1, the wafer W having a predetermined pattern with a trench or hole is held by the atmosphere transfer mechanism 36 and is carried from the carrier C to the load lock chamber 6a or 6b, the load lock chamber is decompressed to the same degree of vacuum pressure as the second vacuumed transfer chamber 21, and the wafer W in the load lock chamber is held by the second transfer mechanism 26 and is carried to the degas chamber 5a or 5b through the second vacuumed transfer chamber 21, thereby degassing the wafer W. Subsequently, the wafer W in the degas chamber 5a or 5b is held by the first transfer mechanism 16 and is loaded in the barrier film-forming unit 12a or 12b through the first vacuumed transfer chamber 11, and a barrier film such as a Ti film, a TiN film, a Ta film, a TaN film or the like is formed thereon. After the formation of the barrier film, the wafer W is held by the first transfer mechanism 16 and is carried from the barrier film-forming unit 12a or 12b to the Ru liner film-forming unit 14a or 14b, which in turn forms the Ru liner film. After the formation of the Ru liner film, the wafer W is held by the first transfer mechanism 16 and is carried from the Ru liner film-forming unit 14a or 14b to the buffer chamber 5. Next, the wafer W is held by the second transfer mechanism 26 and is carried to the Cu film-forming unit 22a or 22b through the second vacuumed transfer chamber 21, and a Cu film is formed thereon. After the formation of the Cu film, the wafer W is held by the second transfer mechanism 26 and is carried from the Cu film-forming unit 22a or 22b to the load lock chamber 6a or 6b, the load lock chamber is recovered to atmospheric pressure, and the Cu film-formed wafer W is carried to the carrier C by the atmosphere transfer mechanism 36. The above procedure is repeated by the number of the wafers W stocked in the carrier C.

<Cu Film-Forming Unit>

Next, a description will be made of a Cu film-forming unit 22a or 22b, which is an important element to implement the method of the present disclosure.

Figure 2:
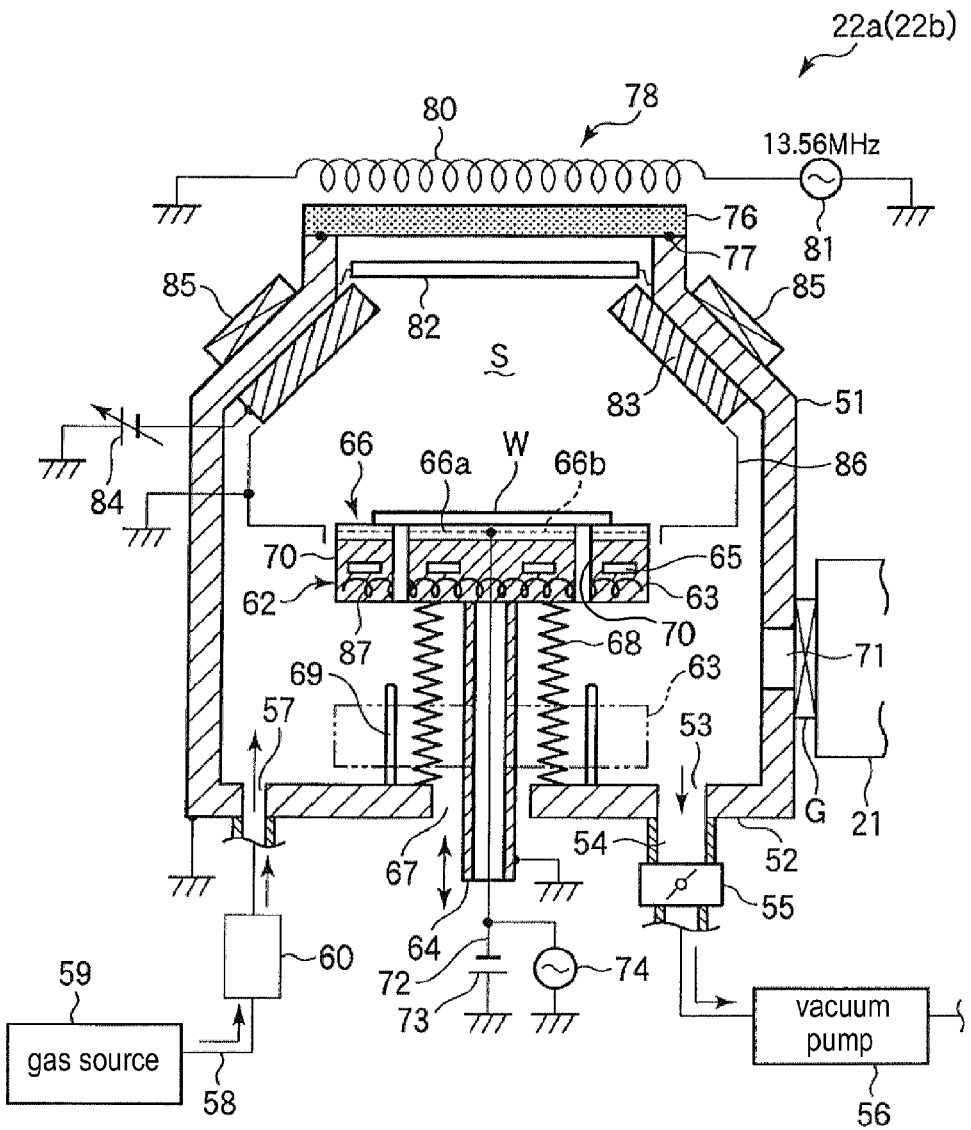
FIG. 2 is a cross-sectional view showing a Cu film-forming unit built in the film-forming system of FIG. 1 for forming a Cu film.

FIG. 2 is a cross-sectional view showing an example of the Cu film-forming unit. Here, the Cu film-forming unit employs for example an Inductively Coupled Plasma (ICP) type plasma sputtering apparatus that is an Ionized Physical Vapor Deposition (iPVD) apparatus.

As shown in FIG. 2, the Cu film-forming unit 22a or 22b includes a barrel type processing vessel 51 formed of e.g. aluminum or the like. The processing vessel 51 is grounded to the earth and is provided in the bottom 52 of the processing vessel 51 with an exhaust port 53 to which an exhaust pipe 54 is connected. A throttle valve 55 and a vacuum pump 56 are connected to the exhaust pipe 54, so that the processing vessel 51 can be vacuumed through the exhaust pipe. In addition, a gas inlet port 57 is formed in the bottom 52 of the processing vessel 51 in order to introduce gas through the inlet port 57. A gas supply pipe 58 is connected to the gas inlet port 57, and a gas source 59 is connected to the gas supply pipe 58 in order to supply rare gases as plasma-exciting gases such as Ar gas or other required gas, e.g. $N_2$ gas. In addition, a gas control unit 60 consisting of a flow controller, a valve, and the like is mounted in the gas supply pipe 58.

The processing vessel 51 includes therein a mounting table 62 the wafer W of a target substrate. The mounting table 62 includes a disk-type mounting stage 63 and a hollow barrel type column 64 which supports the mounting stage 63 while being grounded to the earth. The mounting stage 63 is formed of a conductive material such as aluminum alloy or the like, and is grounded to the earth via the column 64. The mounting stage 63 has therein a cooling jacket 65 through which a cooling medium is supplied via a cooling medium passageway which is not shown. In addition, the mounting stage 63 has therein an embedded resistance heater 87 which is clad with an isolation material. The resistance heater 87 is supplied an electric power from a power source which is not shown. The mounting stage 63 is provided with a thermocouple which is not shown, so that a wafer can be controlled to have a predetermined temperature by controlling supply of a cooling medium to the cooling jacket 65 and power supply to the resistance heater 87 based on the temperature detected by the thermocouple.

On the mounting stage 63, a thin disk-type electrostatic chuck 66 in which an electrode 66b is embedded in a dielectric member 66a such as alumina or the like is provided in order to adsorb and hold the wafer W thereon by means of electrostatic force. The lower portion of the column 64 extends downwards through a through hole 67 formed at the center of the bottom 52 of the processing vessel 51. The column 64 is vertically movable by an elevator which is not shown, so that the entire of the mounting table 62 can be moved up and down.

A corrugated metal bellows 68 which is extensible/compressible is mounted to surround the column 64 such that an upper portion thereof is hermetically attached to the lower surface of the mounting stage 63, and a lower portion thereof is hermetically attached to the upper surface of the bottom 52 of the processing vessel 51, so that it allows the mounting table 62 to be moved up and down while maintaining airtightness in the processing vessel 51.

Further, for example three (two in FIG. 2) support pins 69 are vertically mounted on the bottom 52, and pin holes 70 are formed in the mounting stage 63 to correspond to the support pins 69. Thus, when the mounting stage 63 is moved down, the upper portions of the support pins 69 penetrating into the pin holes 70 support and hold the wafer W and transfers it to a carrier arm (not shown) which comes from the outside. Thus, the processing vessel 51 is provided in a lower sidewall with an entrance 71 through which the carrier arm comes in and out and to which an openable/closable gate valve G is mounted. The above-mentioned second vacuumed transfer chamber 21 is connected to the opening 71 through the gate valve G.

A power source 73 is connected to the electrode 66b of the electrostatic check 66 via a power supply line 72, so that when DC voltage is applied to the electrode 66b from the power source 73, the wafer W is adsorbed and held on the electrostatic chuck by means of electrostatic force. In addition, an RF bias power source 74 is connected to the power supply line 72, through which RF bias power is supplied to the electrode 66b such that it is applied to the wafer W. The frequency of RF power preferably ranges between 400 kHz and 60 MHz, particularly 13.56 MHz.

In the meantime, an RF-permeable plate 76 formed of a dielectric such as alumina is hermetically mounted on the ceiling of the processing vessel 51 by means of a seal member 77 such as an O-ring or the like. In addition, on the RF-permeable plate 76, a plasma source 78 is mounted in order to generate plasma using rare gases for generation of plasma such as Ar gas, which are provided in a processing space S in the processing vessel 51. The gases for generation of plasma may use other rare gases than Ar gas, such as He, Ne, Kr, etc.

The plasma source 78 has an induction coil 80 which is mounted to correspond to the RF-permeable plate 76, and an RF source 81 of e.g. 13.56 MHz is connected to the induction coil 80 for generation of plasma, so that RF power is supplied in the processing space S through the RF-permeable plate 76 to induce an induced electric field.

In addition, a baffle plate 82 formed of e.g. aluminum is mounted underneath the RF-permeable plate 76 in order to diffuse the supplied RF power. In addition, under the baffle plate 82, a Cu target 83 is mounted to surround the upper portion of the processing space S such that for example as viewed in a section, it is inclined towards an inner side as it goes upwards, so that it is shaped like an annular form (e.g. truncated conical shell). A variable-voltage DC power source 84 is connected to the Cu target 83 in order to apply DC power for attracting Ar ions. Alternatively, an AC power source may be used instead of a DC power source.

Further, a magnet 85 is mounted to the outer circumference of the Cu target 83 to create a magnetic field. The Cu target 83 is sputtered into Cu atoms or atomic groups by Ar ions in the plasma and they are mostly ionized during passage through the plasma.

In addition, a cylindrical protection cover member 86 formed of e.g. aluminum or copper is mounted to a lower portion of the Cu target 83 in such a manner as to surround the processing space S. The protection cover member 86 is grounded to the earth and a lower portion thereof is bent inwards so that an end portion thereof is located adjacent the sides of the mounting stage 63. Thus, an inner end of the protection cover member 86 is mounted to surround the outer circumferential side of the mounting stage 63.

Further, the respective sections of the Cu film-forming unit 22a or 22b are to be controlled by the above-mentioned control unit 40.

In the Cu film-forming unit 22a or 22b constructed as such, the wafer W is introduced into the processing vessel 51 shown in FIG. 2, the wafer W is loaded on the mounting stage 63 and electrostatically adsorbed on the electrostatic check 66, and the following processes are carried out under the control of the control unit 40. Here, the mounting stage 63 is heated to a predetermined temperature by controlling a heater 87.

First, the gas control unit 60 is controlled to allow Ar gas to flow at a predetermined flow rate in the processing vessel 51 which is vacuumed to a predetermined vacuum pressure by means of the vacuum pump 56, and at the same time, the throttle valve 55 is controlled so as to maintain the processing vessel 51 to have a predetermined vacuum level. Next, DC voltage is applied to the Cu target 83 from the variable DC power source 84, and RF power (plasma power) is also supplied to the induction coil 80 from the plasma source 78. Meanwhile, a predetermined level of RF bias power is supplied to the electrode 66b of the electrostatic chuck 66 from the RF bias power source 74.

Consequently, in the processing vessel 51, Ar plasma and therefore Ar ions are generated by RF power supplied to the induction coil 80, and these ions are attracted towards the Cu target 83 by means of DC voltage applied to the Cu target 83 and collide with the Cu target 83, sputtering the Cu target 83 and emitting Cu elements. Here, an amount of Cu elements emitted by DC voltage applied to the Cu target 83 is optimally controlled.

The Cu element, i.e. Cu atoms and atomic groups, sputtered from the Cu target 83 are mostly ionized during passage through plasma. Here, the Cu elements are scattered downwards in a state in which Cu ions and electrically neutral Cu atoms are mixed. In the present embodiments, the pressure of the processing vessel 51 is raised to a certain level so that the plasma density is increased, thereby ionizing Cu elements at a high efficiency rate. Here, the ionization rate can be controlled by RF power supplied from the RF power source 81.

When the Cu ions are introduced into an ion sheath region which is formed in the thickness of about a few mm on the wafer W by means of the RF bias power applied to the electrode 66b of the electrostatic chuck 66 from the RF bias power source 74, they are accelerated and attracted with strong directivity towards and are deposited on the wafer W, thereby forming the Cu film. Here, the bias power applied to the electrode 66b of the electrostatic chuck 66 from the RF bias power source 74 is controlled so that the film-forming of the Cu film and etching of the Cu film by Ar ions are controlled, thereby implementing appropriate film-forming. This will be described in detail later.

<Barrier Film-Forming Unit>

The barrier film-forming unit 12a or 12b may use a film-forming unit having the same structure as that of FIG. 2 by only changing the material of the Cu target 83, so as to form a barrier film by plasma sputtering. Further, the film-forming method of the barrier film-forming unit is not limited to the plasma sputtering, but may employ other PVD such as conventional sputtering, ion plating, or the like, Chemical Vapor Deposition (CVD) or Atomic Layer Deposition (ALD), or CVD or ALD using plasma. In the context of reduction in impurities, PVD may be preferred.

<Ru Film-Forming Unit>

Figure 3:
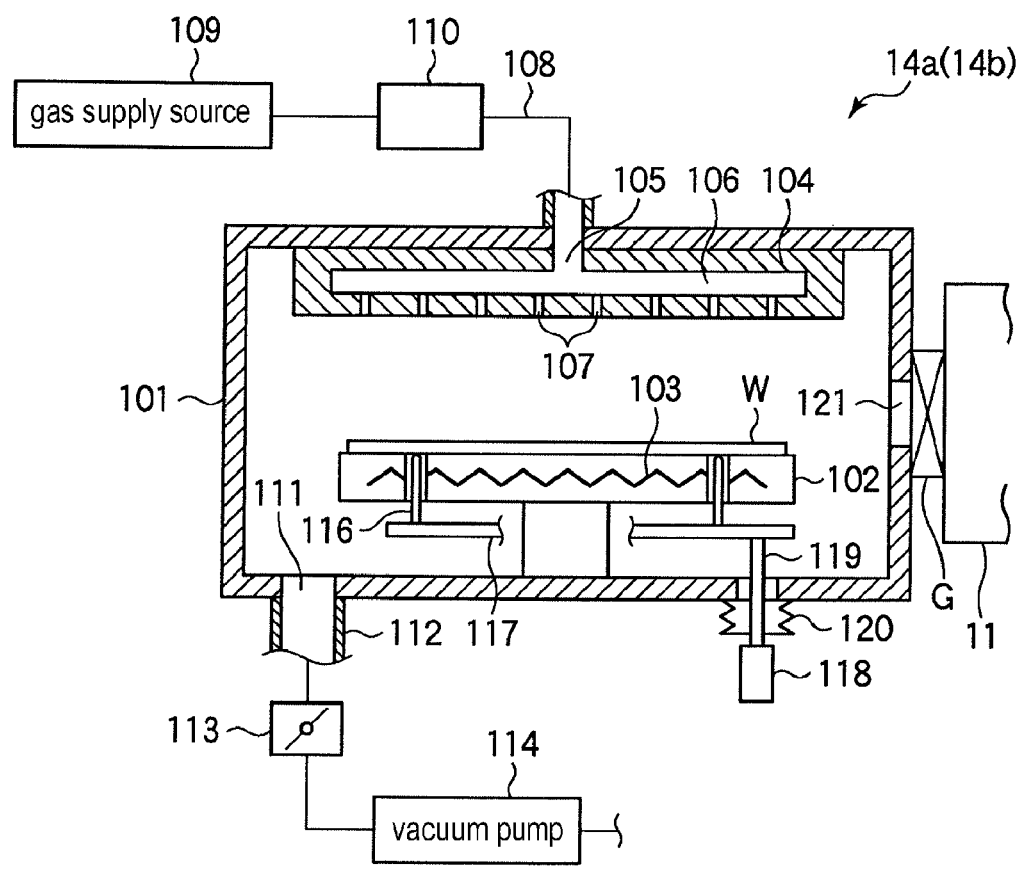
FIG. 3 is a cross-sectional view showing a Ru film-forming unit built in the film-forming system of FIG. 1 for forming a Ru film.

Next, a description will be made of a Ru film-forming unit 14a or 14b for forming a Ru liner film. The Ru liner film may be properly formed by means of thermal CVD. FIG. 3 is a cross-sectional view showing an example of the Ru film-forming unit in which the Ru film is formed by thermal CVD.

As shown in FIG. 3, the Ru film-forming unit 14a or 14b has a barrel type processing vessel 101 formed of e.g. aluminum. The processing vessel 101 includes therein a mounting stage 102 formed of e.g. ceramics such as MN and on which a wafer W is loaded. The mounting stage 102 has a heater 103 therein. The heater 103 is supplied an electric power by a heater power source (not shown) so as to generate heat.

A shower head 104 is provided opposite to the mounting stage 102 on the ceiling of the processing vessel 101 in order to introduce processing gases or purge gases for formation of the Ru film into the processing vessel 101 in the form of showers. The shower head 104 has a gas inlet port 105 at an upper portion thereof and a gas-diffusion space 106 therein. A plurality of gas discharge holes 107 is formed in the bottom of the shower head 104. A gas supply pipe 108 is connected to the gas inlet port 105, and a gas supply source 109 is connected to the gas supply pipe 108 in order to supply processing gases or purge gases for formation of the Ru film. In addition, a gas control unit 110 consisting of a flow controller, a valve, and the like is mounted in the gas supply pipe 108. Ru-forming gases may include ruthenium carbonyl [$Ru_3(CO)_{12}$]. The ruthenium carbonyl is thermally decomposed into Ru, so that the Ru film can be formed on the wafer W.

An exhaust port 111 is provided in the bottom of the processing vessel 101, and an exhaust pipe 112 is connected to the exhaust port 111. A throttle valve 113 and a vacuum pump 114 which control the pressure are connected to the exhaust pipe 112, so that the processing vessel 101 can be vacuumed.

Three wafer support pins 116 (only two pins are shown) for carrying a wafer are mounted in the mounting stage 102 such that they come in and out of the surface of the mounting stage 102 in a state of being fixed to a support plate 117. The wafer support pins 116 are moved up and down through the support plate 117 by a rod 119 being moved up and down by a drive mechanism 118 such as an air cylinder or the like. Reference numeral 120 denotes a bellows. Meanwhile, a wafer entrance 121 is formed in a sidewall of the processing vessel 101, so that a wafer W comes in and out between the processing vessel and the first vacuumed transfer chamber 11 with a gate valve G opened.

In the Ru film-forming unit 14a or 14b constructed as such, the gate valve G is opened and the wafer W is loaded on the mounting stage 102, the gate valve G is closed and the processing vessel 101 is evacuated by means of the vacuum pump 114 such that the processing vessel 101 is controlled to have a predetermined level of pressure, and processing gases such as ruthenium carbonyl [$Ru_3(CO)_{12}$] are introduced into the processing vessel 101 from the gas supply source 109 through the gas supply pipe 108 and the shower head 104 with the wafer W heated to a predetermined level of temperature through the mounting stage 102 by means of the heater 103. Thus, the processing gases react with the surface of the wafer W, forming the Ru film on the wafer W.

In addition to ruthenium carbonyl, the Ru film-forming material may use pentadienyl ruthenium compounds such as for example (cyclopentadienyl)(2,4-dimethylpentanienyl)ruthenium, bis(cyclopentadienyl)(2,4-methylpentadienyl)ruthenium, (2,4-dimethylpentadienyl) (ethylcyclopentadienyl)ruthenium, or bis(2,4-methylpentadienyl) (ethylcyclopentadienyl) ruthenium, together with decomposition gas such as $O_2$ gas. In addition, the Ru film may be formed by PVD. However, CVD using ruthenium carbonyl may be preferred because good step coverage can be obtained and impurities in the film can be reduced from the CVD using ruthenium carbonyl.

<Method of Forming Cu Wiring>

Figure 4:
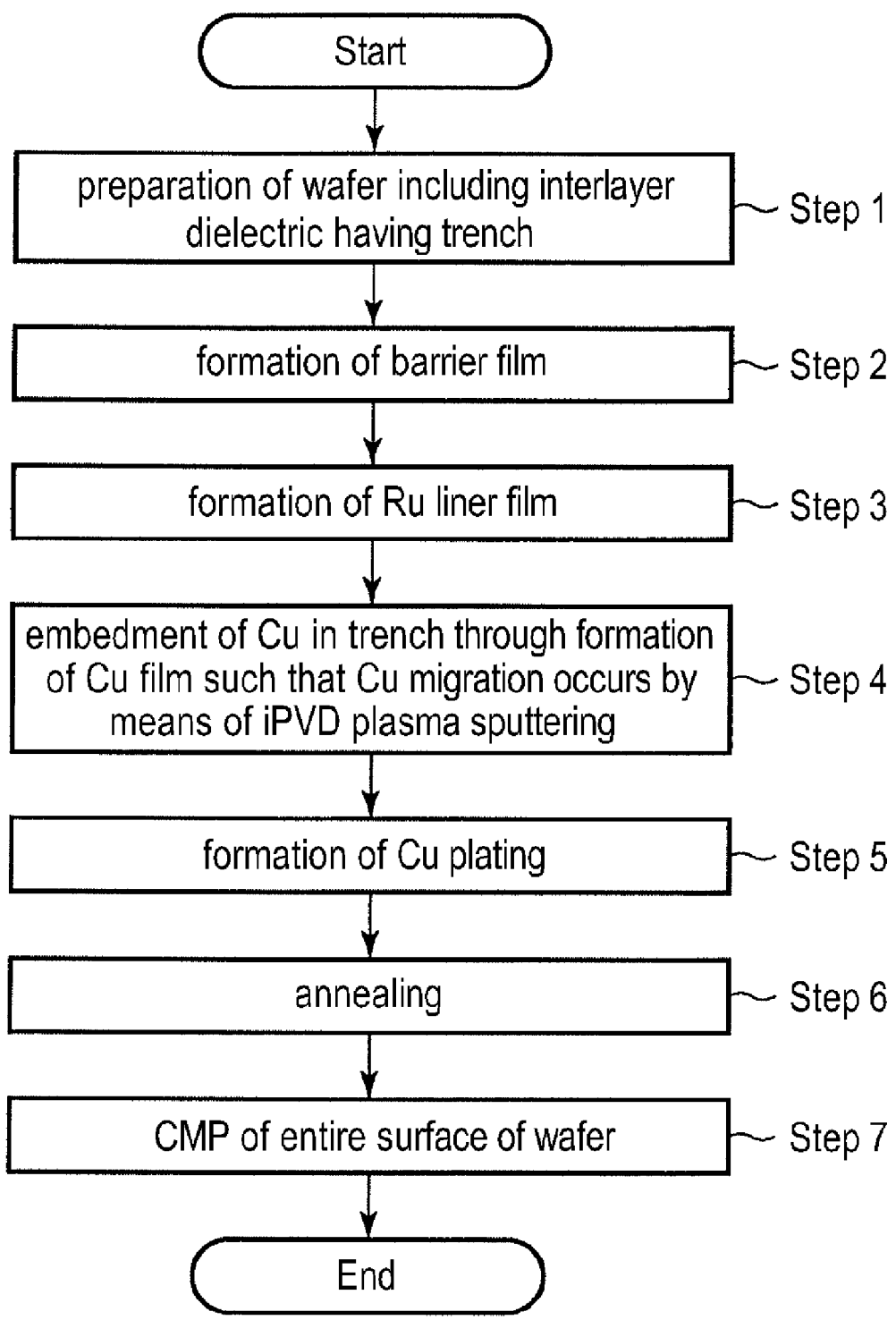
FIG. 4 is a flowchart showing a procedure of the method of forming the Cu wiring according to the first embodiment.

Next, a method of forming Cu wiring according to a first embodiment will be described with reference to the flowchart of FIG. 4 and the cross-sectional process views of FIG. 5A to FIG. 5F.

Figure 5A:
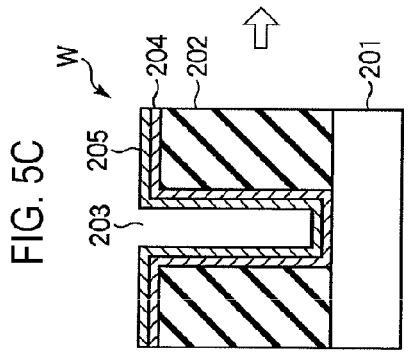
FIG. 5A to FIG. 5F are a cross-sectional process view explaining a procedure of the method of forming the Cu wiring according to the first embodiment, respectively.

In the present embodiment, first, a wafer W is provided in which an interlayer dielectric 202 such as a $SiO_2$ film is formed on a base structure 201 (detailed structure is not shown), and a trench 203 and a via (not shown) for connection to a lower layered wiring are formed in the interlayer dielectric [step 1, FIG. 5A]. The wafer W may preferably be a wafer in which moisture remaining on the surface of a dielectric layer or foreign matter formed upon etching/ashing are removed by a degas or pre-clean process. In the present embodiment, such a wafer W is introduced into the film-forming system of FIG. 1 and is degassed in the degas chamber 5a or 5b.

Figure 5B:
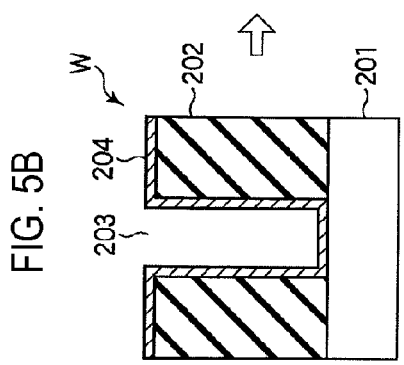

Next, the wafer W is introduced into the barrier film-forming unit 12a or 12b so as to form a barrier film 204 on the entire surface of the wafer including the trench 203 to shield (barrier) against Cu [step 2, FIG. 5B].

The barrier film 204 may preferably have a high barrier characteristic against Cu and low resistance. The barrier film may properly use a Ti film, a TiN film, a Ta film, a TaN film, or a Ta/TaN film. Further, the barrier film may use a TaCN film, a W film, a WN film, a WCN film, a Zr film, a ZrN film, a V film, a VN film, a Nb film, a NbN film, or the like. Since a Cu wiring has lower resistance as the volume of Cu increases, the barrier film may preferably be made thinner. From this point of view, the thickness may preferably range between 1 nm and 20 nm. More preferably, the thickness may range between 1 nm and 10 nm. The barrier film may be formed by plasma sputtering. Alternatively, the barrier film may be formed by other PVD such as conventional sputtering, ion plating or the like, CVD or ALD, or CVD or ALD using plasma.

Figure 5C:
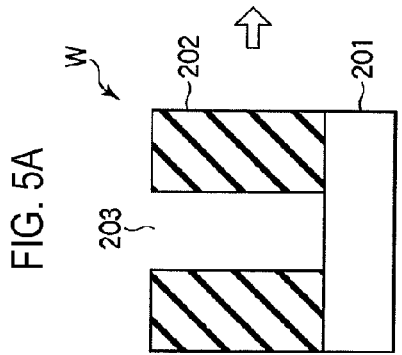

Subsequently, a Ru liner film 205 is formed on the barrier film 204 using the Ru liner film-forming unit 14a or 14b [step 3, FIG. 5C]. In order to reduce resistance of a wiring when increasing the volume of Cu to be embedded, the Ru liner film may preferably have a thin thickness of e.g. 1 nm to 5 nm. The Ru liner film may be properly formed of ruthenium carbonyl [$Ru_3(CO)_{12}$] as a film-forming material by thermal CVD using the film-forming unit shown in FIG. 3. Accordingly, a high purity, very thin Ru film can be formed with high step coverage. The film-forming condition is that, for example, the pressure of the processing vessel ranges between 1.3 Pa and 66.5 Pa, and film-forming temperature (wafer temperature) ranges between 150° C. and 250° C. In addition to ruthenium carbonyl, the Ru liner film 205 may be formed using other film-forming material such as pentadienyl ruthenium compounds such as for example (cyclopentadienyl)(2,4-dimethylpentanienyl)ruthenium, bis(cyclopentadienyl)(2,4-methylpentadienyl)ruthenium, (2,4-dimethylpentadienyl) (ethylcyclopentadienyl)ruthenium, or bis(2,4-methylpentadienyl) (ethylcyclopentadienyl)ruthenium, by means of CVD or PVD.

Figure 5D:
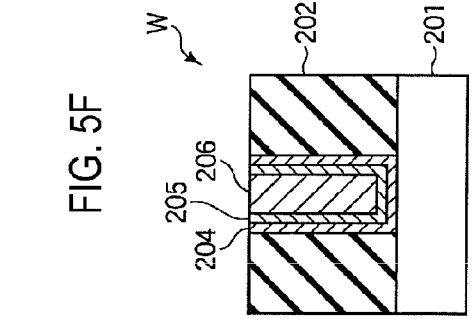

Subsequently, a Cu film 206 which becomes a Cu wiring is formed using the Cu film-forming unit 22a or 22b comprising a plasma sputtering apparatus that is an iPVD apparatus such that migration of Cu occurs by applying a bias to the mounting stage of FIG. 2 on which the wafer W is loaded, thereby embedding Cu in the trench 203 and the via (not shown) [step 4, FIG. 5D].

In the plasma sputtering apparatus, with application of the bias, Cu ions emitted from the target are attracted towards the wafer W thereby to increase the film-forming rate, but if bias power increases excessively, the Cu film that is only deposited slightly becomes sputtered by a sputtering phenomenon (etching) that occurs at the surface of the wafer W owing to ions of plasma-generating gas (e.g. Ar ions), so that when applied, the bias power is restricted to the extent that the Cu film is not sputtered. Further, according to the related art, it has been known that PVD causes unfavorable step coverage and therefore occurrence of pinch off which blocks an opening of a trench or hole, so that the formation of a Cu wiring through embedding the trench or hole is not carried out using only PVD.

In this regard, it has been discovered that if a Ru liner film is formed as a base film of a Cu film, and bias power is regulated while the wafer W is heated to a certain temperature so as to control the film-forming action of Cu ions and the etching action of plasma-generating gas ions (Ar ions), because Ru has high wettability with Cu, Cu migrates (flows) on the Ru liner film without agglutination, thereby embedding Cu in the trench or hole without blocking an opening of the trench or hole (without overhang). Thus, Cu can be surely embedded in a fine trench or hole without generating voids. Further, if embedment of Cu is carried out using PVD as such, impurities are reduced to increase purity, and the size of grain increases, so that compared to the case of embedding Cu by means of Cu plating, the Cu wiring has low resistance.

Figure 5E:
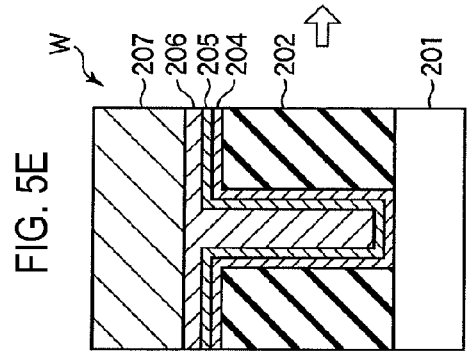
Figure 5F:
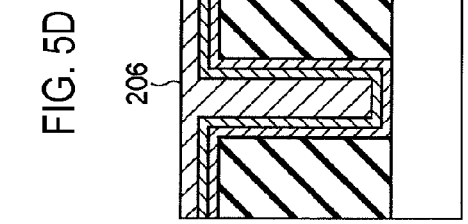

Next, the wafer W in which the Cu film is formed so as to embed Cu in the trench or hole is carried from the film-forming system 1 to a Cu plating unit, which in turn forms a Cu plating film 207 on the entire surface of the wafer W [step 5, FIG. 5E]. Next, if needed, the wafer is annealed to increase the grain size of Cu and stabilize the Cu plating film 207 (step 6), and then the wafer W is CMP processed thereby to completely remove the Ru liner film 205 and the barrier film 204 not remaining on the entire surface of the wafer W [step 7, FIG. 5F]. Thereby, the Cu film 206 remaining in the trench or hole serves as a Cu wiring.

<Cu Film-Forming of Step 4>

Next, the Cu film-forming of step 4 will be described in detail.

Figure 6:
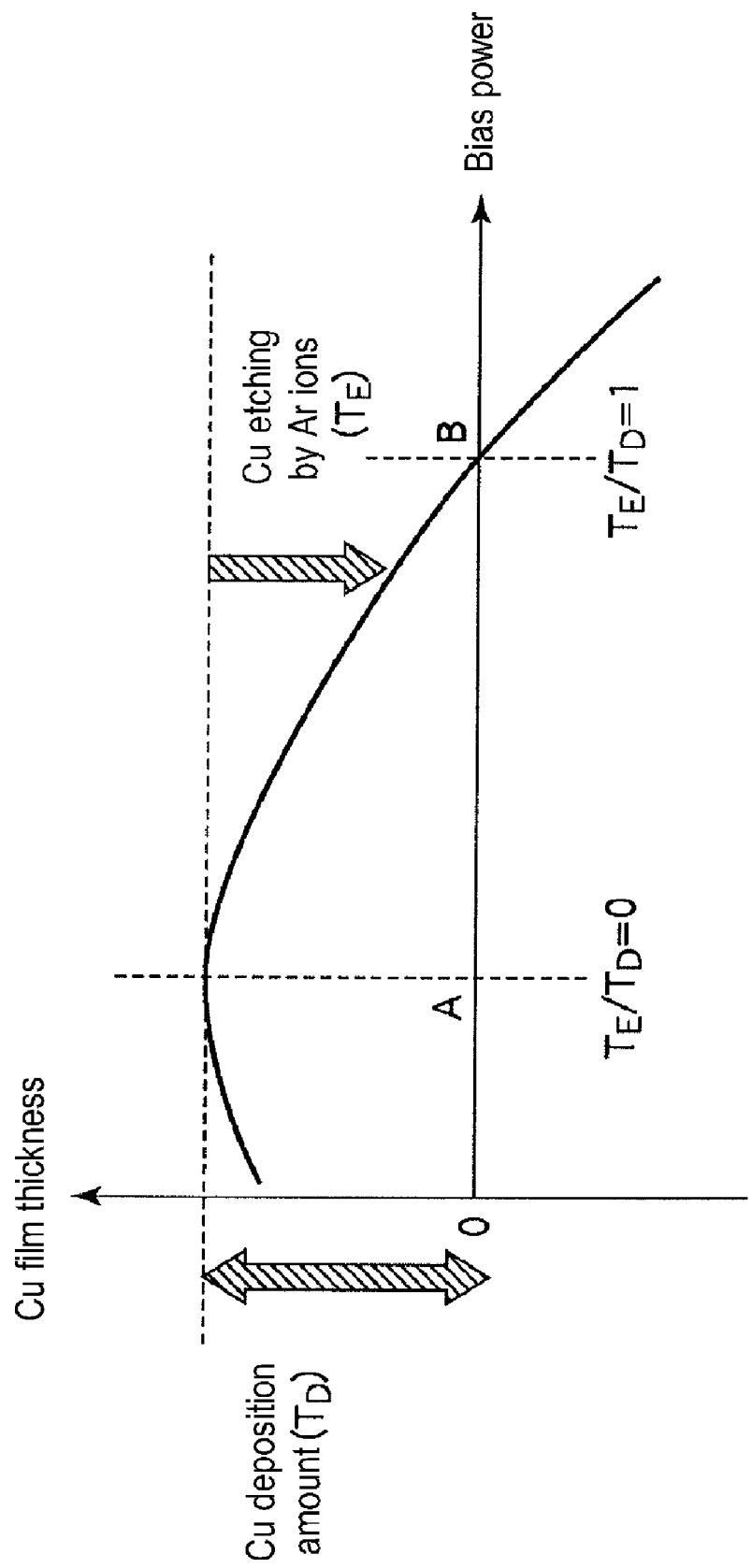
FIG. 6 is a schematic view showing correlation between bias power and an amount of Cu film formation when the Cu film is formed by the Cu film-forming unit of FIG. 2.

As described before, the Cu film-forming of step 4 employs a plasma sputtering apparatus as shown in FIG. 2 which performs plasma sputtering while attracting ions towards the surface of the wafer W by means of bias application. Here, the correlation between the bias power and a deposition amount of the Cu film is schematically shown in FIG. 6. That is, since as the bias power increases, the amount of introduced Cu ions increases, the deposition amount also increases up to a certain value. However, after the certain value, the deposition amount decreases because of the sputtering action (etching action) of plasma-generating gas ions (e.g. Ar ions) at the surface of the wafer W. In the present embodiment, in order to embed the Cu film in the trench or via (hole) using temperature control and an action of the plasma-generating gas ions, as shown in FIG. 6, the bias power preferably has a range larger than A but lower than B, in which the action of plasma-generating gas ions exists and the film-forming is still proceeded. That is, assuming that the deposition amount of Cu (film-forming rate) is $T_D$, and the etching amount (etching rate) by the plasma-generating gas ions is $T_E$, while at A, $T_E/T_D=0$, and at B, $T_E/T_D=1$, $T_E/T_D>0$ is preferred because it is preferred that energy of plasma-generating gas ions (Ar gas ions) exist in order to allow Cu to flow (migrate) on the Ru liner film. However, if the temperature is high, Cu can flow even when $T_E/T_D=0$. Meanwhile, $T_E/T_D<1$ is required in order to prevent etching from occurring as the film-forming is proceeded.

A film-forming model within the range will be schematically described in FIG. 7. As shown in FIG. 7A, when Cu film-forming begins by applying bias in a state where Cu ions and Ar ions of plasma-generating gas ions exist, as shown in FIG. 7B, Cu deposited on an opening of the trench is etched by Ar ions, and at the same time, Cu migrates into the trench due to action of the Ar ions according to the temperature, so that, as shown in FIG. 7C, Cu can embed the trench without blocking the opening of the trench.

Next, a preferred process condition of the Cu film-forming of step 4 will be described.

In the present embodiment, it is required that Cu is allowed to migrate by the plasma-generating gas ions such as Ar ions, so that the wafer temperature should be raised compared to the case of conventional plasma sputtering. Thus, the wafer temperature may preferably have a range between 65° C. and 350° C. In addition, in Cu film-forming, the pressure of the processing vessel (process pressure) has a range of preferably 1 mTorr to 100 mTorr (0.333 Pa to 13.3 Pa), more preferably 35 mTorr to 90 mTorr (4.66 Pa to 12.0 Pa). In addition, DC power supplied to the Cu target has a range of preferably 4 kW to 12 kW, more preferably 6 kW to 10 kW.

Further, while the bias power is set to a range of $0 \leq T_E/T_D<1$, preferably $0<T_E/T_D<1$, migratability of Cu by plasma-generating gas ions (Ar ions) depends upon temperature, so that if the film-forming temperature (T) is low, the migratability of Cu is reduced. Thus, within the preferred range of $65 \leq T(° C.) \leq 350$, while at the high temperature range of $200<T(° C.) \leq 350$, $0 \leq T_E/T_D<1$ may be adequate, and at the low temperature range of $65 \leq T(° C.) \leq 200$, $0.02 \leq T_E/T_D<1$ may be preferred. Here, the bias power density preferably has a range of 1.74 W/cm² or less (bias power: 1200 W) at $200<T(° C.) \leq 350$, and 0.15 to 1.74 W/cm² (100 to 1200 W) at $65 \leq T(° C.) \leq 200$. More preferably, at $65 \leq T(° C.) \leq 350$, $0.05 \leq T_E/T_D \leq 0.24$, and the bias power density is 0.38 to 0.76 W/cm² (bias power: 260 to 520 W).

Figure 8A:
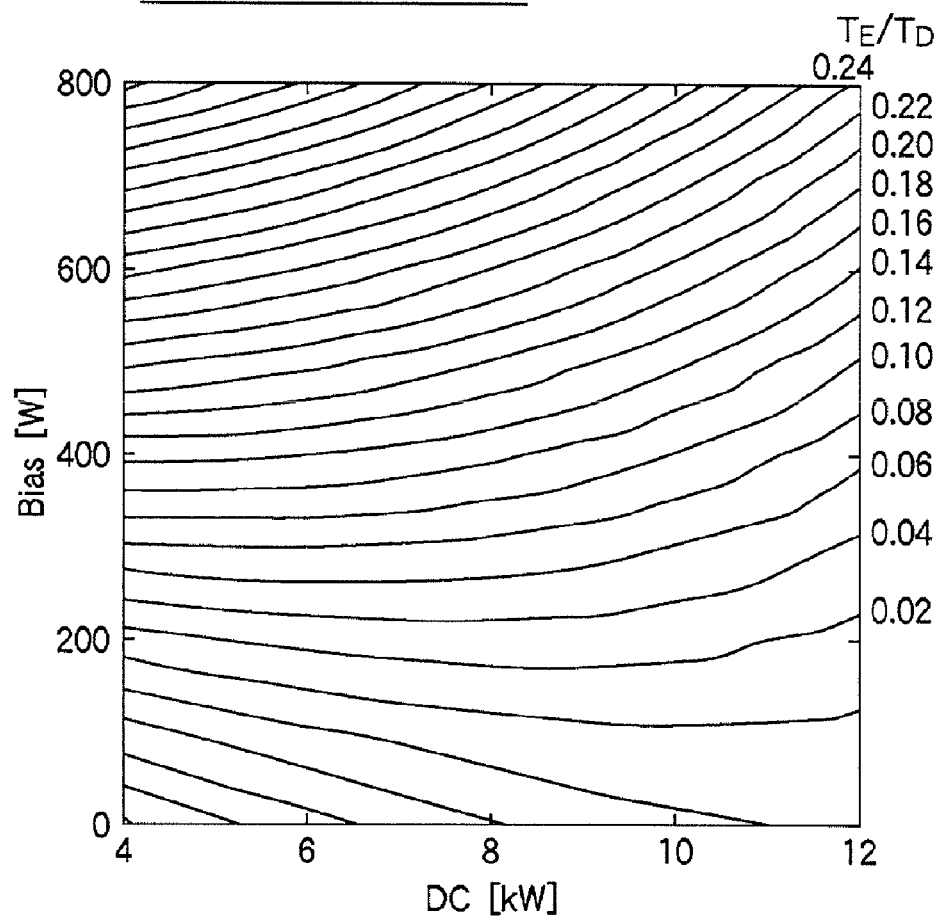

FIGS. 8A and 8B are graphical diagrams showing values of $T_E/T_D$ in contour lines with respect to a horizontal axis of DC power supplied to a Cu target 83 from the DC power source 84 and a vertical axis of a bias power from the RF power source 74 when a Cu film is actually formed under the process pressure of 90 mT (FIG. 8A) and 35 mT (FIG. 8B) using the Cu film-forming unit of FIG. 2. In addition, the RF power supplied to the induction coil 80 from the RF power source 81 is set to 4 kW, and a distance between the Cu target and the wafer W is set to 240 mm.

Figure 9A:
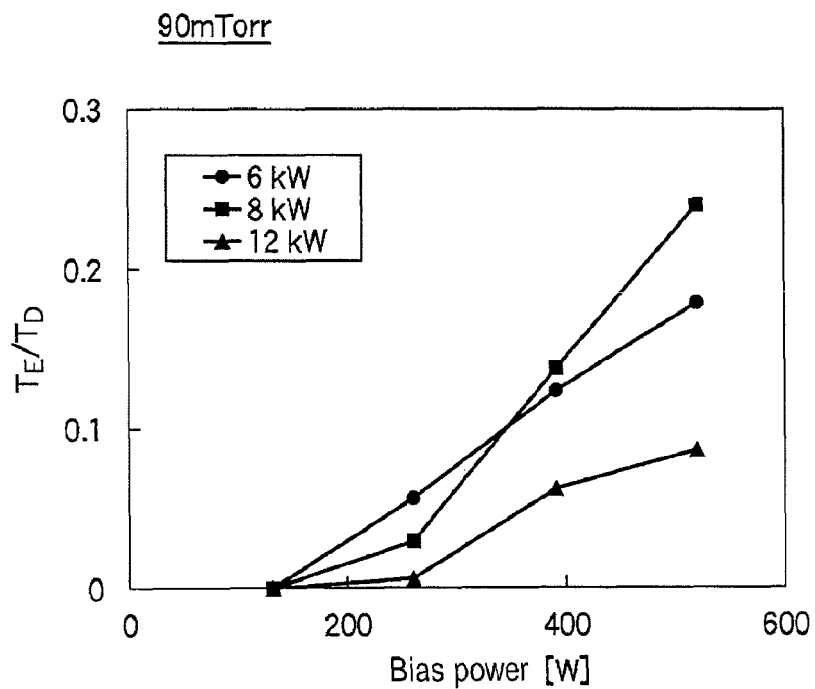
FIGS. 9A and 9B are graphical diagrams showing values of DC power supplied to a Cu target with respect to a horizontal axis of a bias power and a vertical axis of a value of $T_E/T_D$ when a Cu film is actually formed under the process pressure of 90 mT and 35 mT using the Cu film-forming unit of FIG. 2.
Figure 9B:
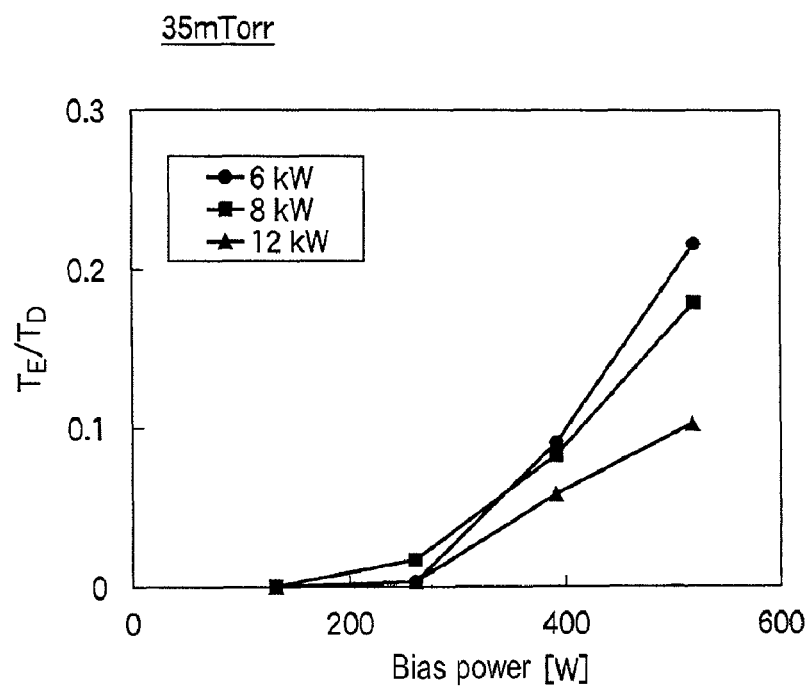
Figure 10A:
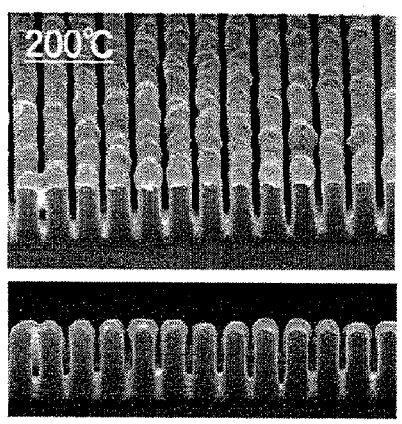
FIGS. 10A to 10D are SEM photographs of Cu films formed under a condition that the bias power is set to 130 W (0.19 W/cm$^2$) that causes $T_E/T_D=0$, and the film-forming temperature is set to 200° C., 225° C., 250° C., and 300° C., respectively.
Figure 10B:
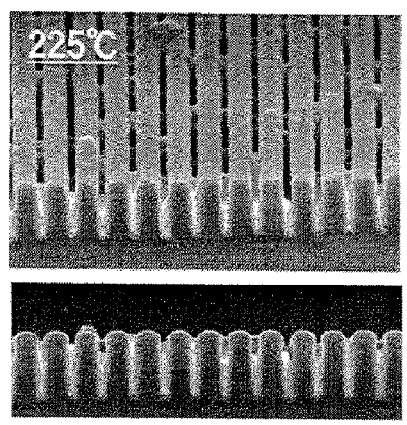
Figure 10C:
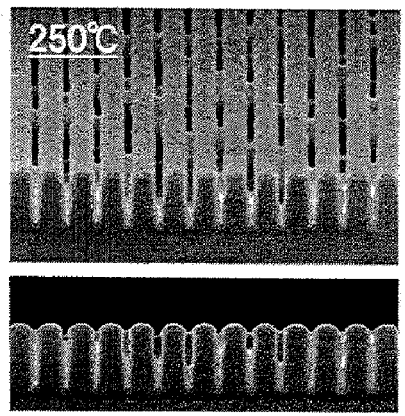
Figure 10D:
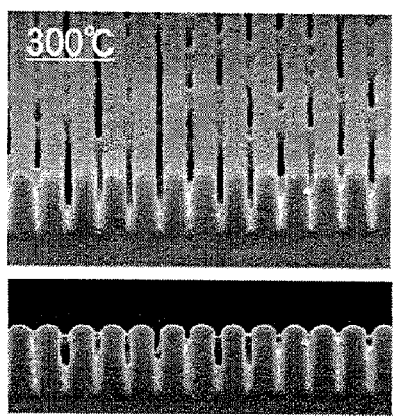

FIGS. 9A and 9B are graphical diagrams showing values of DC power supplied to a Cu target with respect to a horizontal axis of bias power and a vertical axis of a value of $T_E/T_D$ when a Cu film is actually formed under the process pressure of 90 mT (FIG. 9A) and 35 mT (FIG. 9B) using the Cu film-forming unit of FIG. 2. At any pressure and DC power supplied to the Cu target 83, when the bias power is 130 W (bias power density: 0.19 W/cm²), $T_E/T_D=0$, and as the bias power increases, $T_E/T_D$ increases.

Next, after a Ti barrier film and a Ru liner film are formed on an interlayer dielectric having a trench with a width of 30 nm and a depth of 200 nm, a Cu film is formed under a condition that the process pressure: 90 mT, DC power supplied to the Cu target: 8 kW, RF power supplied to the induction coil: 4 kW, a distance between the target and the wafer W: 240 mm, the bias power: 130 W (bias power density: 0.19 W/cm²) that causes $T_E/T_D=0$, the film-forming temperature: 200° C., 225° C., 250° C., and 300° C., and the film-forming time: 55 secs. SEM photographs under the above conditions are shown in FIGS. 10A to 10D. As shown in FIGS. 10A to 10D, it could be seen that embedment of Cu was possible when the film-forming temperature is greater than 225° C. and $T_E/T_D=0$.

Figure 11A:
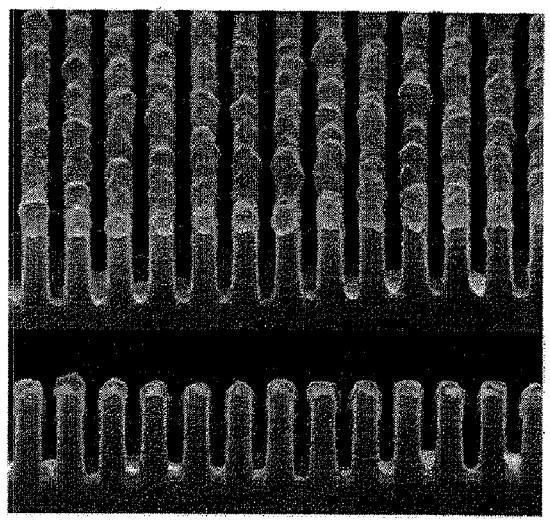
FIGS. 11A and 11B are SEM photographs of Cu films formed under a condition that the film-forming temperature is set to 65° C., and the bias power is set to 130 W (0.19 W/cm$^2$) that causes $T_E/T_D=0$ and 195 W (0.28 W/cm$^2$) that causes $T_E/T_D=0.02$.
Figure 11B:
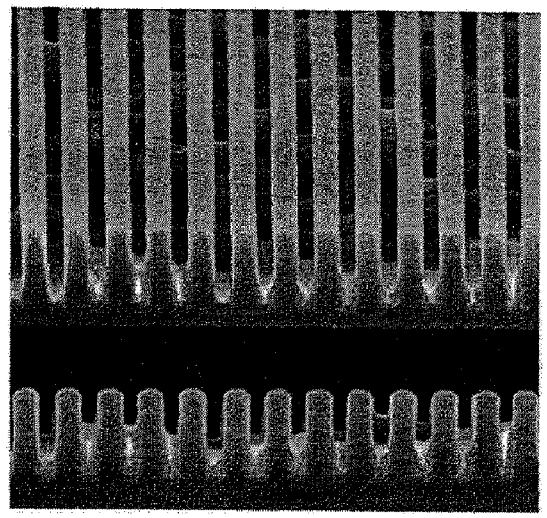
Figure 12A:
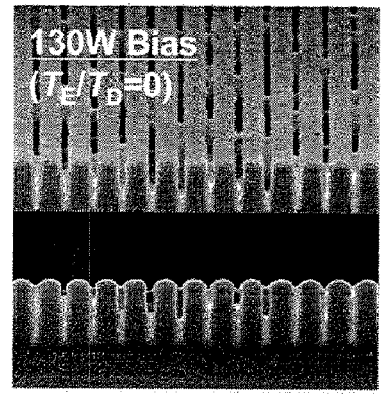

Next, after a Ti barrier film and a Ru liner film are formed on an interlayer dielectric having a trench with a width of 50 nm and a depth of 200 nm, a Cu film is formed under a condition that the process pressure: 90 mT, DC power supplied to the Cu target: 8 kW, RF power supplied to the induction coil: 4 kW, a distance between the target and the wafer W: 240 mm, the bias power: 130 W (bias power density: 0.19 W/cm²) that causes $T_E/T_D=0$ and 195 W (0.28 W/cm²) that causes $T_E/T_D=0.02$, the film-forming temperature: 65° C., and the film-forming time: 55 secs. SEM photographs under the above conditions are shown in FIGS. 11A and 1B. It could be seen that since, at the film-forming temperature of 65° C., the temperature effect upon migration of Cu is small, at 130 W (0.19 W/cm²) that causes $T_E/T_D=0$, as shown in FIG. 11A, Cu was not embedded in the trench, whereas at 195 W (0.28 W/cm²) that causes $T_E/T_D=0.02$, as shown in FIG. 11B, Cu was embedded in the trench.

Next, after a Ti barrier film and a Ru liner film are formed on an interlayer dielectric having a trench with a width of 20~30 nm and a depth of 200 nm, a Cu film is formed under a condition that the process pressure: 90 mT, DC power supplied to the Cu target: 6 kW, RF power supplied to the induction coil: 4 kW, a distance between the target and the wafer W: 240 mm, the bias power: 130 W (bias power density: 0.19 W/cm²) ($T_E/T_D=0$), 260 W (0.38 W/cm²) ($T_E/T_D=0.05$), 390 W (0.57 W/cm²) ($T_E/T_D=0.14$), and 520 W (0.76 W/cm²) ($T_E/T_D=0.24$), the film-forming temperature: 250° C., and the film-forming time: 55 secs. SEM photographs under the above conditions are shown in FIGS. 12A to 12D. As shown in FIGS. 12A to 12D, it could be seen that while at $0 \leq T_E/T_D \leq 0.24$, embedment of Cu occurred, and at $0.05 \leq T_E/T_D \leq 0.24$, more preferable embedment was obtained.

Figure 13:
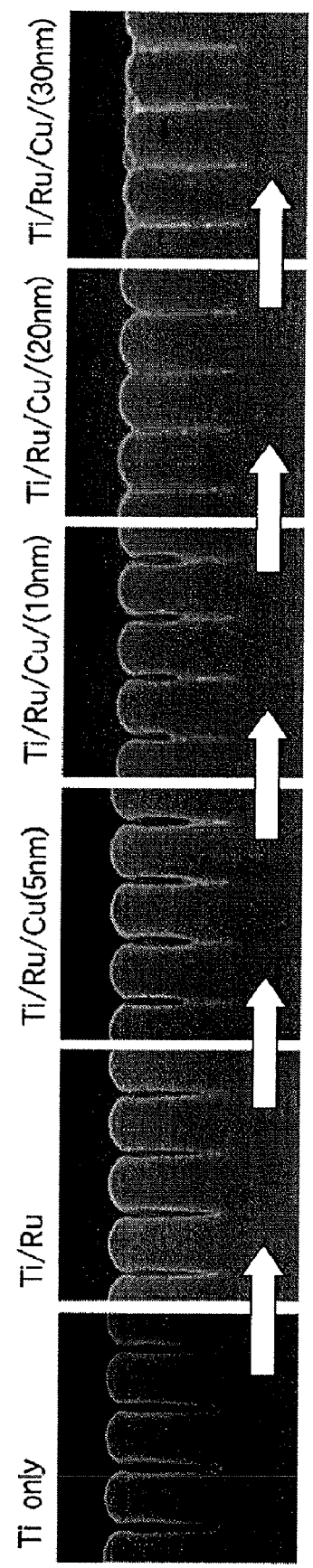
FIG. 13 is a SEM photograph showing a procedure of forming a Cu wiring according to the first embodiment, including forming only a Ti barrier film, forming a Ru film thereon, and forming a Cu film thereon in a thickness of 5 nm, 10 nm, 20 nm, and 30 nm, respectively.
Figure 12D:
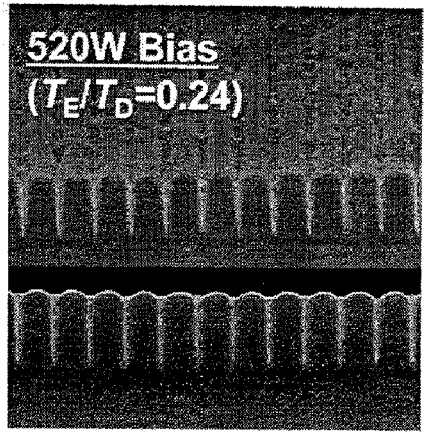

Next, after a Ti barrier film is formed on an interlayer dielectric having a trench with a width of 18 nm and a depth of 200 nm, and a Ru liner film is subsequently formed, a Cu film is formed and embedded under a condition of the present embodiment that the process pressure: 90 mT, DC power supplied to the Cu target: 6 kW, RF power supplied to the induction coil: 4 kW, and a distance between the target and the wafer W: 240 mm. SEM photographs under the above conditions of only Ti barrier film-formed state, Ru liner film-formed state, and Cu film-formed (in thickness of 5 nm, 10 nm, 20 nm, and 30 nm) state are shown in FIG. 13. As shown in FIG. 13, it could be seen that according to the present embodiment, Cu was embedded in a fine trench without occurring voids.

<Evaluation of Cu Wiring Formed by First Embodiment>

Figure 14:
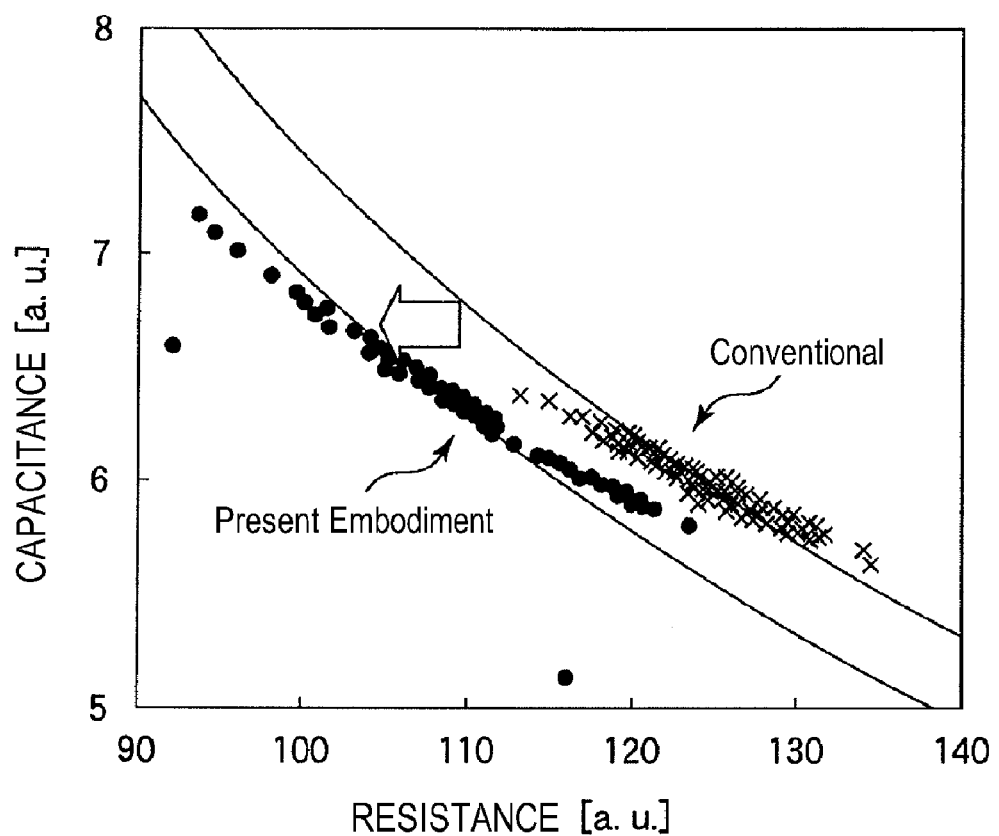
FIG. 14 is a graphical diagram showing a comparison result of electrical characteristics between a Cu wiring formed according to the first embodiment of the present disclosure and a conventional Cu wiring formed by Cu plating.

Next, a comparison was made of electrical characteristics between a Cu wiring according to the first embodiment and a conventional Cu wiring which is formed by forming a Cu barrier film on a barrier film by means of PVD and embedding Cu by means of Cu plating. FIG. 14 shows the comparison result of electrical characteristics of these wirings each having a line width of 60 nm. As shown in this figure, it could be seen that the Cu wiring according to the first embodiment had reduced resistance compared to the conventional wiring.

2. Second Embodiment

Next, a second embodiment of the present disclosure will be described.

<Film-Forming System>

Also in the present embodiment, the film-forming system 1 used in the first embodiment can be used, and all units can be configured similar to those of the first embodiment.

According to the present embodiment, in the film-forming system 1, up to Ru film-forming, operations are performed as in the first embodiment, and then, the wafer W is held by the first transfer mechanism 16 and is carried from the Ru liner film-forming unit 14a or 14b to the buffer chamber 5. Next, the wafer W is held by the second transfer mechanism 26 and is carried to the Cu film-forming unit 22a or 22b through the second vacuumed transfer chamber 21. Further, a first Cu film which embeds the trench or via (hole) and a second Cu film overburdened thereon are formed. Here, the first Cu film is formed under the condition that embedment characteristic of Cu in the trench or hole is taken into consideration, and the second Cu film is formed under the condition of increased film-forming rate. After the formation of the Cu film, the wafer W is held by the second transfer mechanism 26 and is carried from the Cu film-forming unit 22a or 22b to the load lock chamber 6a or 6b, the load lock chamber is recovered to atmospheric pressure, and the Cu film-formed wafer W is carried to the carrier C by the atmosphere transfer mechanism 36. The above procedure is repeated by the number of the wafers W stocked in the carrier.

Further, during the Cu film-forming in the Cu film-forming unit 22a or 22b, the second Cu film is formed at a film-forming rate faster than that of the first Cu film which embeds Cu in the trench or hole. However, the condition may be selected such that, for example, at least one of the pressure of the processing vessel 51 and the temperature of the wafer W becomes lower than the condition when the first Cu film is formed.

Figure 15:
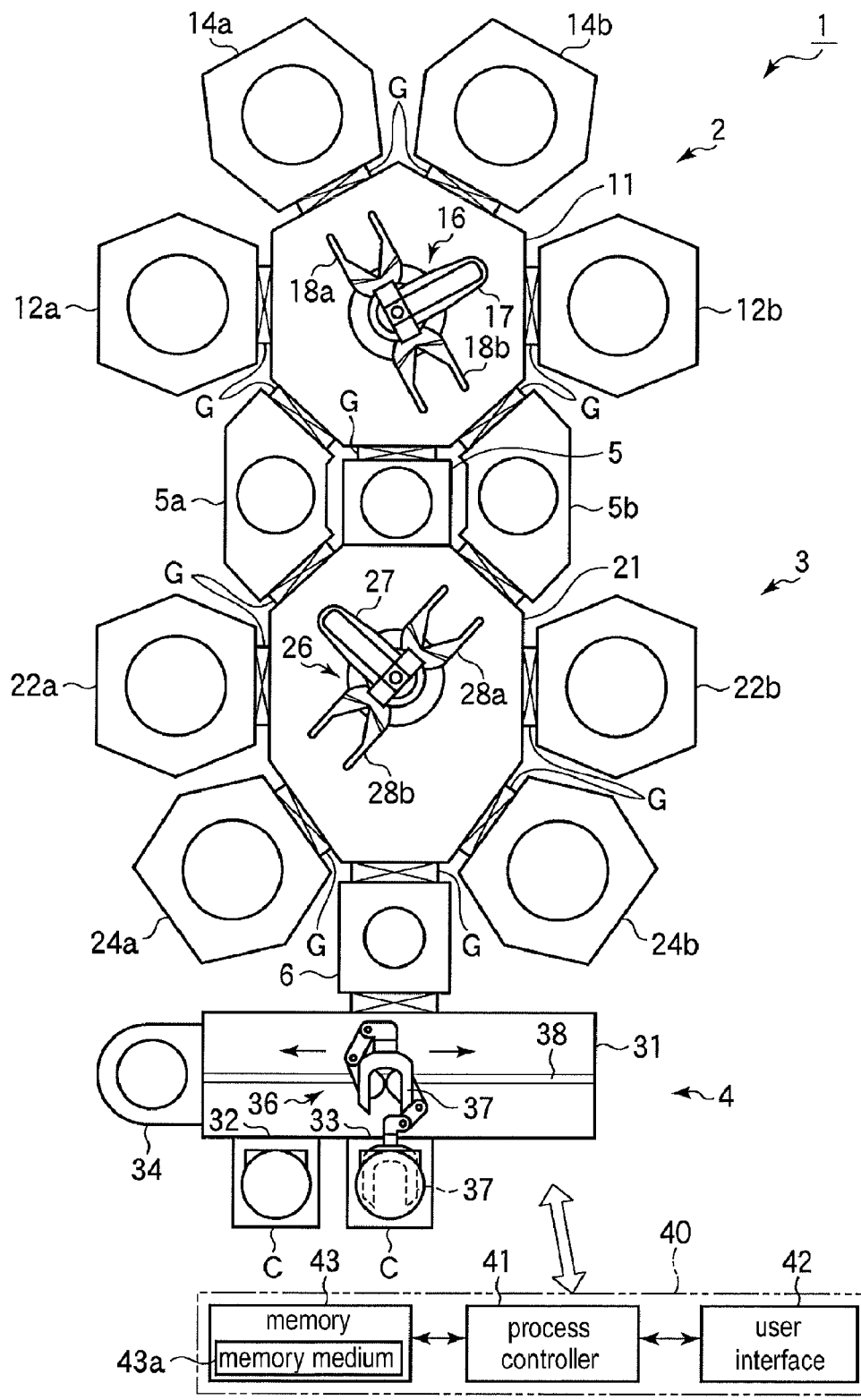
FIG. 15 is a plan view showing another embodiment of a film-forming system.

The present embodiment can employ another film-forming system in which the first Cu film and the second Cu film are respectively formed by separate units. FIG. 15 is a plan view showing another example of a film-forming system. In the film-forming system 1' shown in FIG. 15, a second vacuumed transfer chamber 21 of a second processing section 3 has an octagonal plane, and second Cu film-forming units 24a and 24b as well as first Cu film-forming units 22a and 22b are connected to the second vacuumed chamber 21. In addition, while the film-forming system 1 of FIG. 1 has two load lock chambers 6a and 6b, the present film-forming system 1' of FIG. 15 has only one load lock chamber 6. In the film-forming system of FIG. 15, the first Cu film to be embedded in a trench and/or a hole is formed by the first Cu film-forming unit 22a or 22b which has the same structure as that of the Cu film-forming unit 22a or 22b of FIG. 1, and the second Cu film to be overburdened on the first Cu film is formed by the second Cu film-forming unit 24a or 24b.

<Second Cu Film-Forming Unit 24a or 24b>

The second Cu film-forming unit 24a or 24b may be the same iPVD plasma sputtering apparatus as the first Cu film-forming unit 22a or 22b which may includes a conventional PVD apparatus such as a sputtering apparatus, and may be configured to operate under the condition that the second Cu film is formed at a film-forming rate faster than that of the first Cu film. With such configuration that the first Cu film and the second Cu film are formed by different units, the first and second Cu films can be continuously formed with an increased throughput without change in a condition of the unit, and without exposure to atmosphere (without breaking a vacuum state).

<Cu Wiring-Forming Method>

Figure 16:
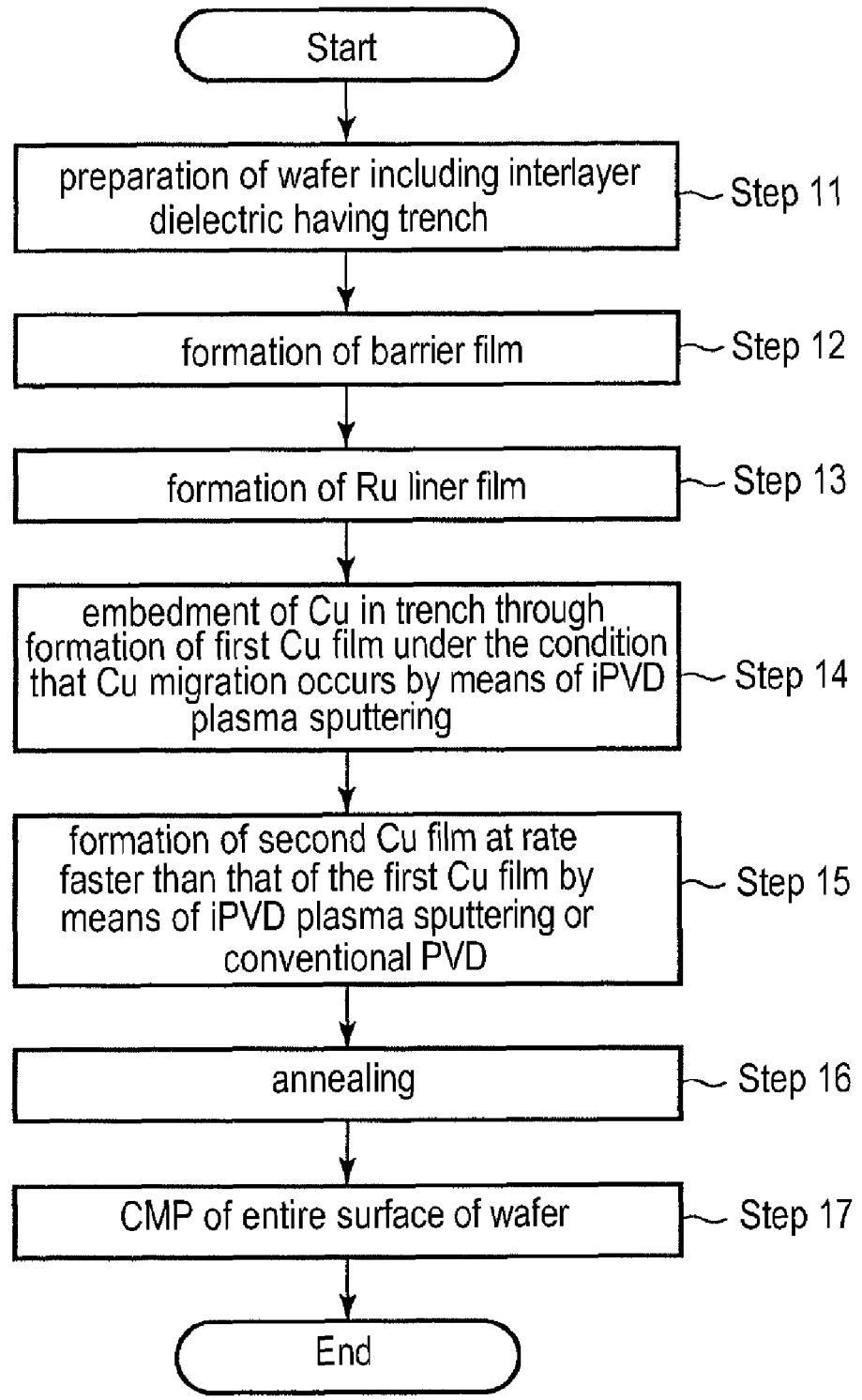
FIG. 16 is a flowchart showing a procedure of a method of forming a Cu wiring according to a second embodiment of the present disclosure.

Next, a Cu wiring-forming method according to a second embodiment will be described with reference to the flowchart of FIG. 16 and the cross-sectional process views of FIG. 17A to FIG. 17F.

In the present embodiment, similar to step 1 of the first embodiment, a wafer W is first provided in which an interlayer dielectric 202 such as a $SiO_2$ film is formed on a base structure 201 (detailed structure is not shown), and a trench 203 and a via (not shown) for connection to a lower layered wiring are formed in a predetermined pattern in the interlayer dielectric [step 11, FIG. 17A]. The wafer W may preferably be a wafer in which moistures remaining on the surface of a dielectric layer or foreign matters formed upon etching/ashing are removed by a degas or pre-clean process. In the present embodiment, such a wafer W is introduced into the film-forming system of FIG. 1 and is degassed in the degas chamber 5a or 5b.

Next, the wafer W is introduced into the barrier film-forming unit 12a or 12b so as to form a barrier film 204 on the entire surface of the wafer including the trench 203 to shield (barrier) Cu [step 12, FIG. 17B].

The film-forming of the barrier film 204 can be performed by completely the same manner as step 2 of the first embodiment. That is, the same film-forming material as in the first embodiment can be used, and thickness range and film-forming method can also be completely the same as those of the first embodiment.

Subsequently, a Ru liner film 205 is formed on the barrier film 204 using the Ru liner film-forming unit 14a or 14b [step 13, FIG. 17C]. The film-forming of the Ru liner film 205 can be performed by completely the same manner as step 3 of the first embodiment. That is, the thickness range and film-forming method can be the same as those of the first embodiment.

Subsequently, a first Cu film 206 to be embedded in the trench 203 or via (not shown) is formed using the Cu film-forming unit 22a or 22b which comprises a plasma sputtering apparatus that is an iPVD apparatus such that migration of Cu occurs by applying a bias to the mounting stage of FIG. 2 on which the wafer W is loaded [step 4, FIG. 17D]. The film-forming of the first Cu film 206 can also be performed by completely the same manner as the film-forming of the Cu film 206 according to the first embodiment.

After embedment of Cu in the trench 203 and the via (hole), in order to form as overburden a Cu film in preparation for a later planarizing process, a second Cu film 208 is formed a overburden on a pattern including the first Cu film 206 at a film-forming rate faster than that of the first Cu film, by means of PVD [step 15, FIG. 17E]. Since the second Cu film 208 is formed as overburden after the first Cu film 206 is embedded in the trench or via (hole), an embedment characteristic may not need to be considered, but high film-forming rate becomes an important factor. Therefore, the second Cu film 208 is formed at a rate faster than that of the first Cu film 206.

After the second Cu film 208 is formed as such, the wafer W is carried out of the film-forming system 1 to an annealing unit (not shown), if needed, so as to perform annealing on the wafer (step 16). Then, the wafer is carried to a CMP unit (not shown) so as to CMP-process and planarize the entire surface of the wafer W while removing the Ru liner film 205, the barrier film 204, and the overburdened Cu film 208 not remaining on the entire surface of the wafer W [step 17, FIG. 17F]. Thereby, the Cu film 206 remaining in the trench or via (hole) serves as a Cu wiring.

Like this, both embedment of Cu in the trench and via (hole), and formation as overburden of Cu can be performed by PVD, so that the Cu wiring can be formed without performing Cu plating. Further, the Cu wiring is formed using the above-mentioned method, thereby obtaining a good embedment characteristic and reduced resistance of a wiring.

Furthermore, the annealing unit and the CMP unit are configured to be controlled by the control unit 40 of the film-forming system 1 of FIG. 1, so that the procedure shown in the flowcharts of FIG. 5A to FIG. 5F can be collectively controlled by a single recipe.

<Description of Second Film-Forming of Step 15>

Next, the second Cu film-forming of step 15 will be described in detail.

The film-forming of the second Cu film can be conducted in series of the film-formation of the first Cu film under a changed process condition by means of the Cu film-forming unit 22a or 22b that is used for formation of the first Cu film. Specifically, at least one of the pressure of the processing vessel 51 and the temperature of the wafer W is set to a value that is lower than the condition when the first Cu film is formed, so that the second Cu film 208 can be formed at a higher rate than the first Cu film 206. That is, while when the first Cu film is formed, the condition of high pressure (e.g. 90 mTorr) that causes high directivity is selected in order to attract a great quantity of Cu ions in the trench or via (hole), and the condition of high film-forming temperature (e.g. 250° C.) is selected in order to cause migration of Cu to occur thereby allowing Cu flowing easily in the trench or via (hole). Since the second Cu film is only formed on the field region, it is preferred that the pressure be set to low pressure of 1-35 mTorr (e.g. 5 mTorr), and the film-forming temperature be set to low temperature of −30-250° C. [preferably, −30° C.~room temperature (25° C.)] (e.g. −30° C.). Thus, at least one of the film-forming pressure and film-forming temperature is set lower than the condition when the first Cu film is formed, thereby forming the second Cu film at higher rate than that of the first Cu film.

Figure 18:
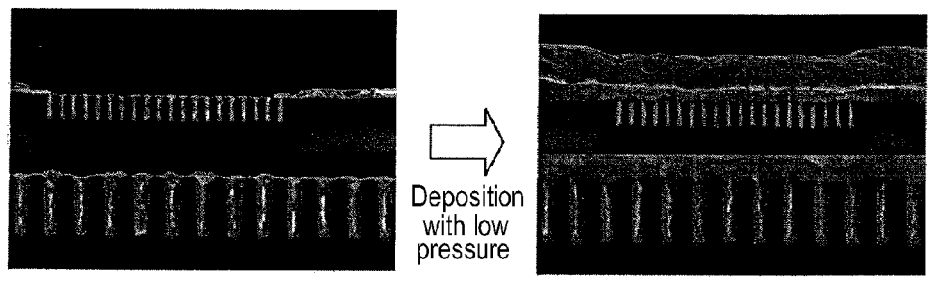
FIG. 18 is a SEM photograph showing a Cu wiring in which a first Cu film is formed and embedded in a trench in a condition of high pressure and high temperature, and then a second Cu film is formed as overburden thereon in a condition of low pressure, using the Cu film-forming unit of FIG. 2.

In actual practice, after a barrier film and a Ru liner film were formed in a trench having a width of 50 nm, a first Cu film was formed under the condition of the pressure of the processing vessel of 90 mTorr and the temperature of 250° C. by means of the Cu film-forming unit of FIG. 2, thereby embedding the trench, and then a second Cu film was formed as overbuy den thereon under the condition of the pressure of the processing vessel of 5 mTorr, by means of the same Cu film-forming unit. SEM photographs obtained under the above conditions are shown in FIG. 18. As shown in FIG. 18, both embedment of the first Cu film in the trench and overburden of the second Cu film thereon were favorably performed.

Figure 19:
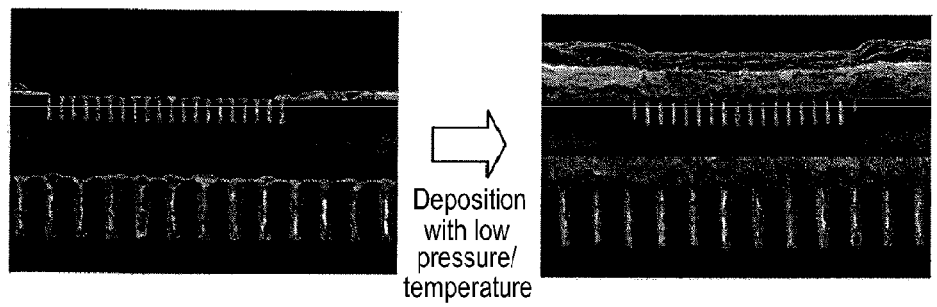
FIG. 19 is a SEM photograph showing a Cu wiring in which a first Cu film is formed and embedded in a trench in a condition of high pressure and high temperature, and then a second Cu film is formed as overburden thereon in a condition of low pressure and low temperature, using the Cu film-forming unit of FIG. 2.

In addition, a first Cu film was formed under the same condition so as to embed the trench, and a second Cu film was formed as overburden thereon under the condition of the pressure of the processing vessel of 5 mTorr and the film-forming temperature of −30° C. SEM photographs obtained under the above conditions are shown in FIG. 19. As shown in FIG. 19, both embedment of the first Cu film in the trench and overburden of the second Cu film thereon were favorably performed.

The film-forming of the second Cu film 208 may be formed by a Cu film-forming unit other than the Cu film-forming unit used for forming the first Cu film 206. In this case, the film-forming may be performed under the above-mentioned condition of low pressure, low temperature, or low pressure and low temperature, using the plasma sputtering apparatus shown in FIG. 2. In addition, the film-forming of the second film may be performed under the condition of higher film-forming rate than that of the first Cu film, using a conventional PVD apparatus such as an iPVD apparatus, a sputtering apparatus, or the like, the structure of which is different from the unit shown in FIG. 2. As set forth above, when the second Cu film 208 is formed using a film-forming unit that is different from the film-forming unit used for forming the first Cu film 206, the film-forming system 1' of FIG. 15 can be used.

Figure 20A:
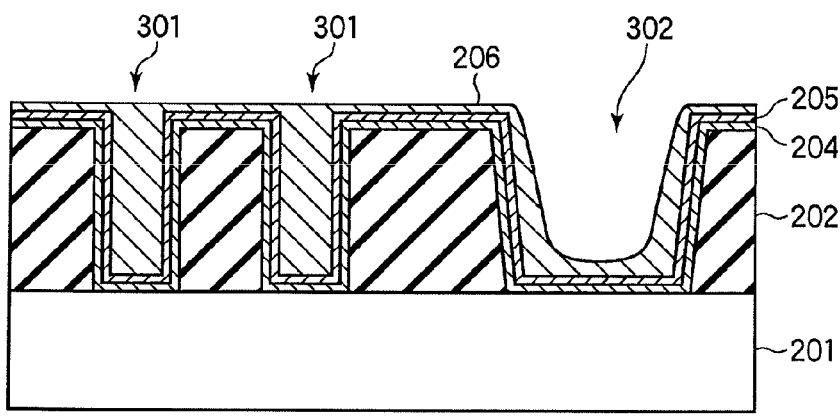
FIGS. 20A and 20B are cross-sectional views showing a Cu wiring in which a first Cu film is formed on a pattern having a relatively narrow trench or hole and a relative wide trench or hole, and then a second Cu film is overburdened thereon.
Figure 20B:
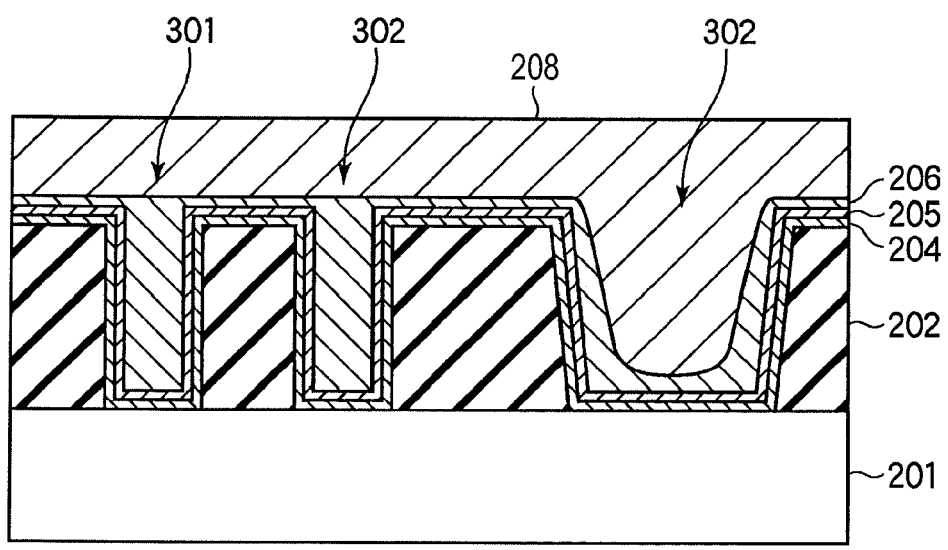

In an actual pattern of a device, a relatively narrow trench or hole and a relatively wide trench or hole are mixed. For example, in a case that a narrow trench 301 and a wide trench 302 are mixed as shown in FIG. 20A, after a barrier film 204 and a Ru liner film 205 are formed, a first Cu film 206 is formed so as to embed both the entire of the relatively narrow trench 301 and a portion of the relatively wide trench 302 (FIG. 20A), and a second Cu film 208 is formed so as to be formed as overburden on the first Cu film 206 at a region of the relatively narrow trench 301 and to be completely embedded in the relatively wide trench 302, thereby further forming an overburdened portion (FIG. 20B). Since the relatively wide trench 302 can be sufficiently embedded with a filler film under the second Cu film-forming condition that a film-forming condition is valued, according to the above method, the Cu film can be formed and favorably embedded in the trench 301 and 302 and other Cu film can be further formed. A hole is the same case.

<Evaluation of Cu Wiring Formed by Second Embodiment>

Figure 21:
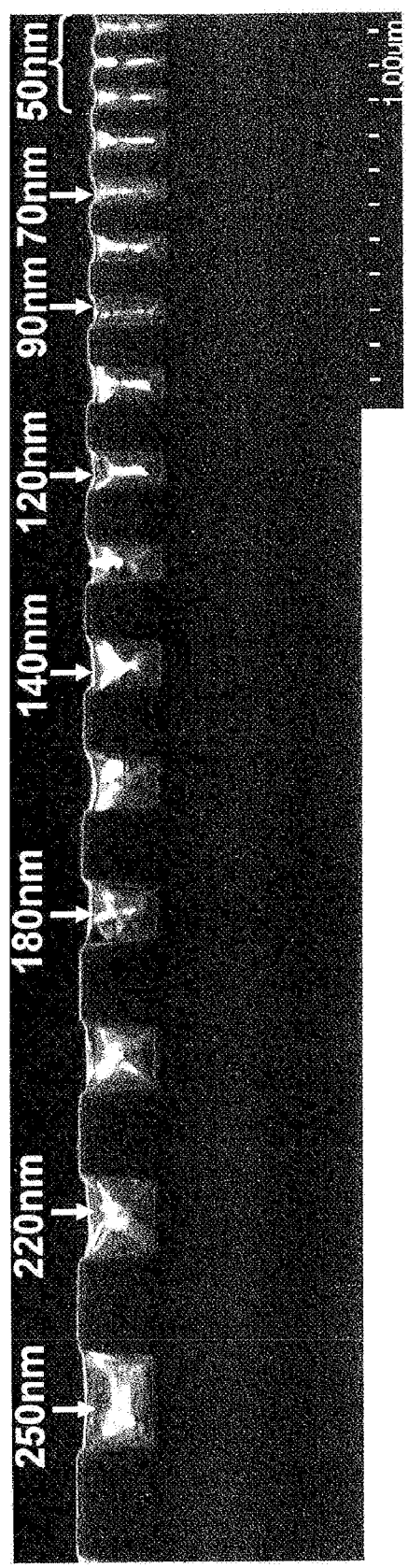
FIG. 21 is a SEM photograph showing a cross-section of a Cu wiring formed on a wafer having trenches with a variety of widths ranging from 50 nm to 250 nm according to the film-forming method of the second embodiment.

Next, a Cu wiring was formed on a wafer having trenches with a variety of widths of 50-250 nm by forming a barrier film, forming a Ru liner film, forming a first Cu film using iPVD, forming a second Cu film using iPVD, annealing the resultant structure, and performing a CMP process on the resultant structure according to the film-forming method of the second embodiment. A SEM photograph of the Cu wiring obtained by the process is shown in FIG. 21. As shown in FIG. 21, it could be seen that any trench with diverse widths was favorably embedded with the filler film.

Figure 22:
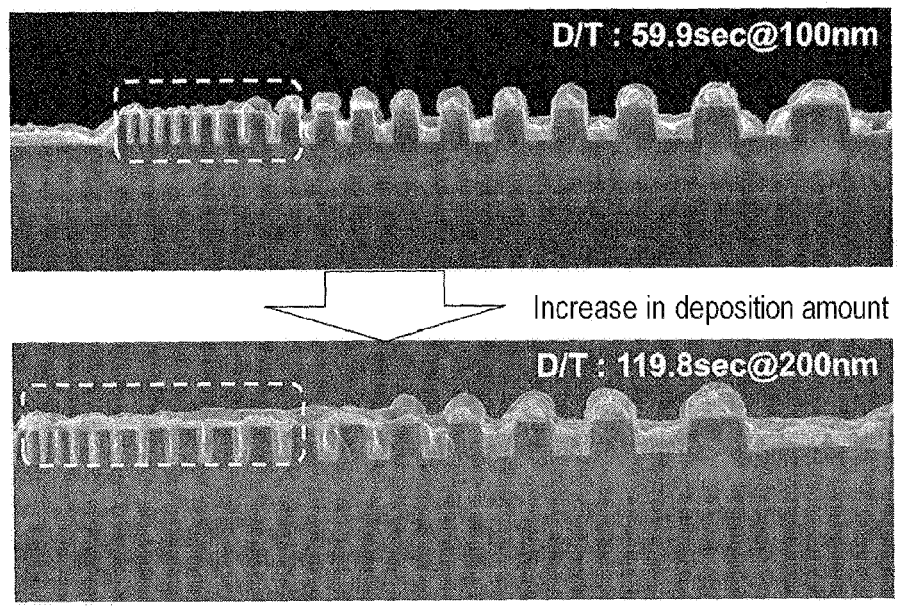
FIG. 22 is a SEM photograph of a Cu wiring in which Cu films are embedded in and deposited on a pattern having relatively narrow and wide trenches according to the film-forming method of the second embodiment.

Next, formation of a barrier film, formation of a Ru liner film, embedment of a first Cu film using iPVD, and embedment (in a wide trench) and overburden (in a narrow trench) of a second Cu film using iPVD were performed on a pattern in which a narrow trench and a wide trench are mixed, according to the film-forming method of the second embodiment. The second Cu film-forming condition was set to RF power supplied to an induction coil: 5.25 kW, DC power supplied to a Cu target: 3 kW, bias power: 200 W, a distance between the target and a wafer W: 200 mm, process pressure: 5 mTorr, and film-forming temperature: 250° C. SEM photographs of the Cu wiring obtained by the process are shown in FIG. 22. As shown in FIG. 22, a fine wiring at the narrow trench was well planarized, and a thick wiring at the wide trench was favorably embedded.

Figure 23:
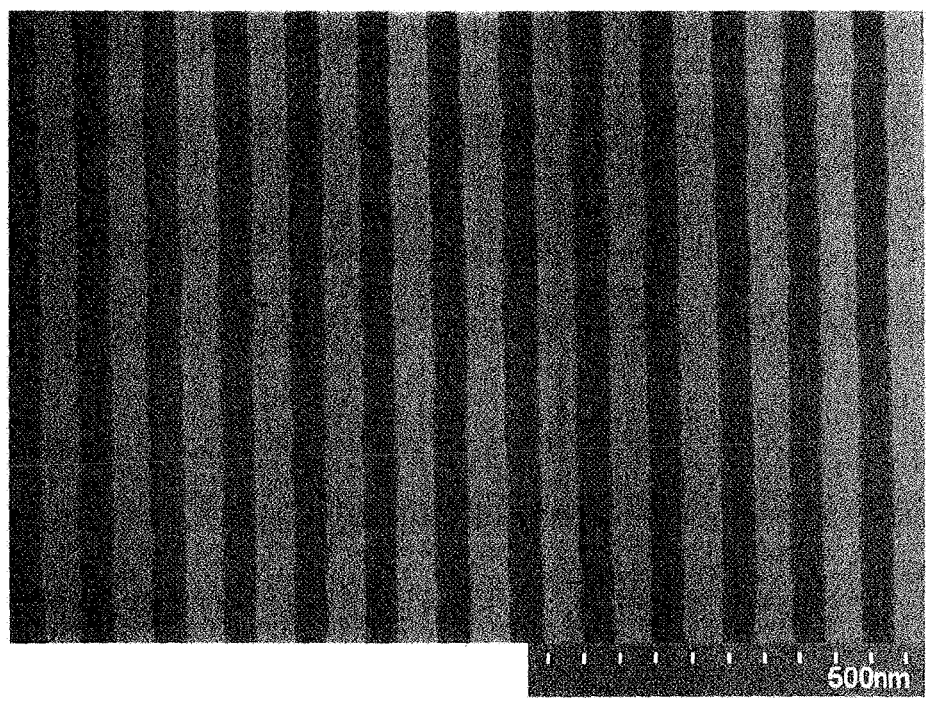
FIG. 23 is a SEM photograph showing the surface of a pattern of a Cu wiring formed on a wafer having a trench pattern with a width of 50 nm according to the film-forming method of the second embodiment.

Next, a Cu wiring pattern was formed on a wafer having a trench pattern with a width of 50 nm by forming a barrier film, forming a Ru liner film, forming a first Cu film using iPVD, forming a second Cu film using iPVD, annealing the resultant structure, and performing a CMP process on the resultant structure according to the film-forming method of the second embodiment. The state of the Cu wiring pattern was examined FIG. 23 shows a SEM photograph of the surface of the pattern. As shown in FIG. 23, it could be seen that the Cu wiring which was formed by forming the films up to the second Cu film for deposition using PVD, annealing the resultant, and performing the CMP, without employing Cu plating, had no defects such as scratches, foreign matters, erosions, etc. on the surface, thereby maintaining integrity of a pattern.

Figure 24:
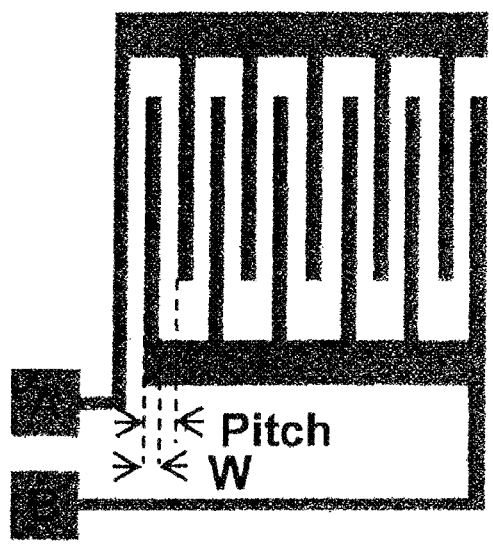
FIG. 24 is a view showing a pattern used for measuring leak current.
Figure 25:
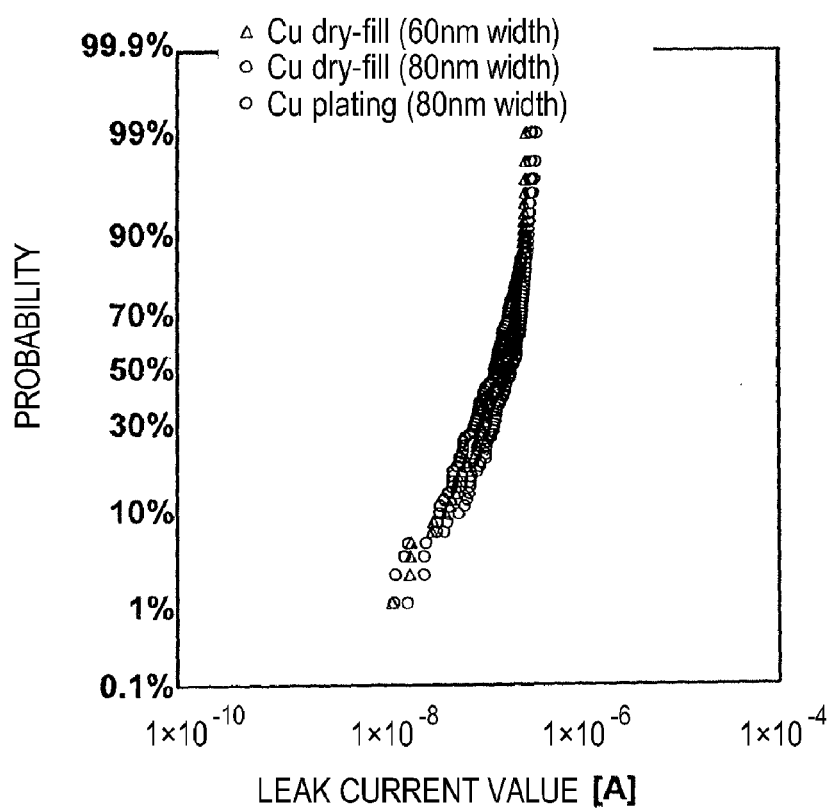
FIG. 25 is a graphical diagram showing measured results of leak current with respect to a Cu wiring pattern, which is formed by the film-forming method of the second embodiment, and a conventional Cu wiring pattern, which is formed by a conventional film-forming method, which are formed on a wafer having a trench pattern of FIG. 24 with a pattern width (W) of 60 nm and 80 nm.

Next, a Cu wiring was formed on a wafer having a trench pattern of FIG. 24 with a pattern width of 60 nm and 80 nm by forming a barrier film, forming a Ru liner film, forming a first Cu film using iPVD, forming a second Cu film using iPVD, annealing the resultant structure, and performing a CMP process on the resultant structure according to the film-forming method of the second embodiment. Then, leak current was measured using the resultant Cu wiring. Similarly, measurement was taken of leak current with respect to a conventional Cu wiring, which was formed on a trench pattern with a width W of 80 nm by forming a barrier film and a Cu seed film, embedding Cu in the resultant trench pattern with Cu plating, annealing the resultant structure, and performing a CMP process on the resultant structure. The results are shown in FIG. 25. As shown in FIG. 25, the Cu wiring (dry-fill) which was formed by performing embedment and deposition by means of PVD and performing annealing and CMP on the resultant structure according to the second embodiment showed a leak current similar to that of the conventional Cu wiring. In view of this, it could be seen that the Cu wiring which was formed by forming the films up to the second Cu film for deposition using PVD, annealing the resultant, and performing the CMP, without employing Cu plating, kept its integrity by characteristic of the wiring.

Figure 26:
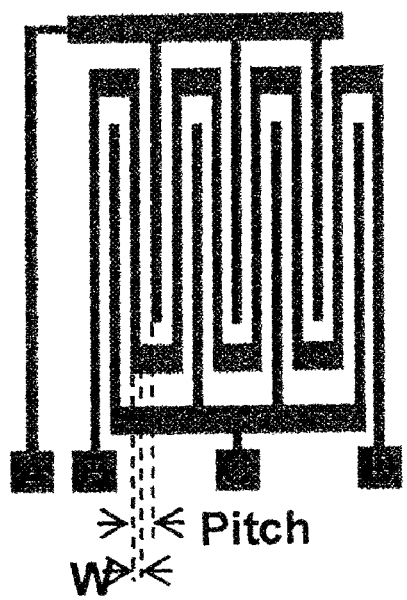
FIG. 26 is a view showing a pattern used for measurement of electrical characteristics (wiring resistance and capacitance).
Figure 27:
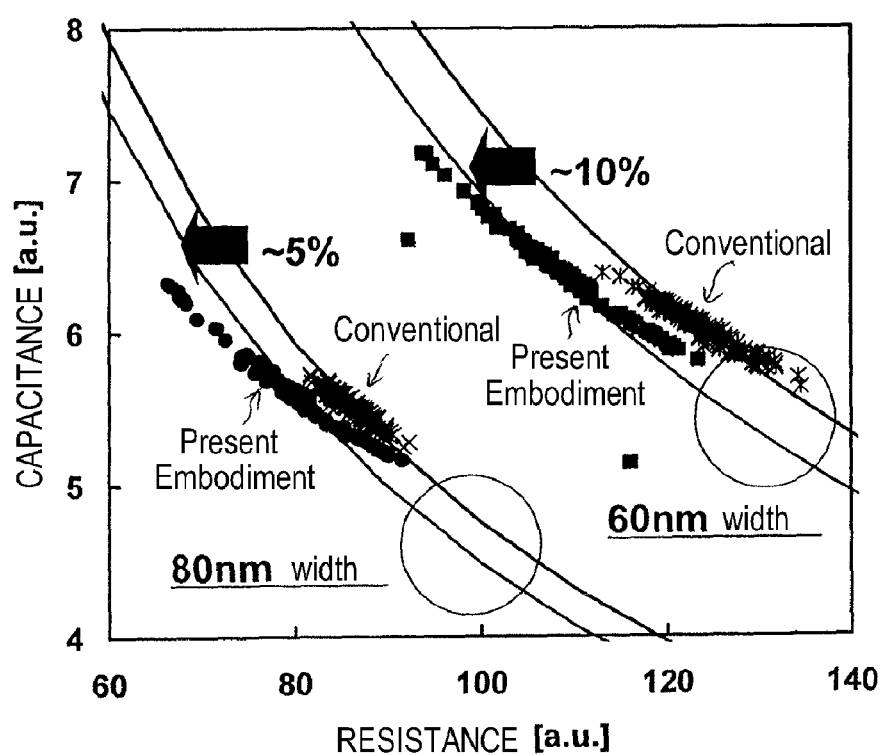
FIG. 27 is a view showing measured results of electrical characteristics (wiring resistance and capacitance) with respect to a Cu wiring pattern, which is formed by the film-forming method of the second embodiment, and a conventional Cu wiring pattern, which is formed by a conventional film-forming method, which are formed on a wafer having a trench pattern of FIG. 26 with a pattern width (W) of 60 nm and 80 nm.

Next, a Cu wiring was formed on a wafer having a trench pattern of FIG. 26 with a pattern width of 60 nm and 80 nm by forming a barrier film, forming a Ru liner film, forming a first Cu film using iPVD, forming a second Cu film using iPVD, annealing the resultant structure, and performing a CMP process on the resultant structure according to the film-forming method of the second embodiment. Then, an electrical characteristic (wiring resistance and capacitance) was measured using the resultant Cu wiring. Similarly, measurement was taken of the electrical characteristic (wiring resistance and capacitance) with respect to a conventional Cu wiring, which was formed on a trench pattern with a width W of 60 nm and 80 nm by forming a barrier film and a Cu seed film, embedding Cu in the resultant trench pattern with Cu plating, annealing the resultant structure, and performing a CMP process on the resultant structure. The results are shown in FIG. 27. As apparent from the figure, the Cu wiring (dry-fill) which was formed by performing embedment and deposition by means of PVD and performing annealing and CMP on the resultant structure according to the second embodiment showed reduced wiring resistance by a reduction percentage of 5% at the pattern width W of 80 nm, and of 10% at the pattern width of 60 nm when compared to that of the conventional Cu wiring. Accordingly, it could be seen that the Cu wiring formed using a dry process (without plating process) had an effect that wiring resistance decreased as the pattern width became narrower.

Figure 28:
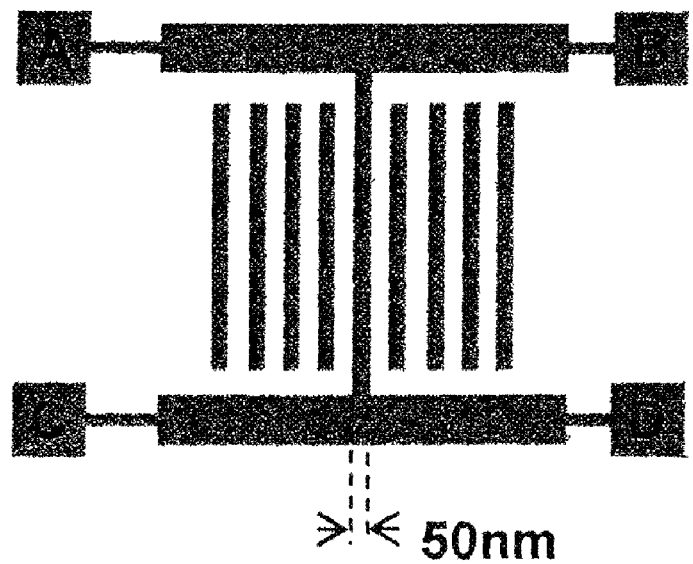
FIG. 28 is a view showing a pattern used for measurement of resistivity.
Figure 29:
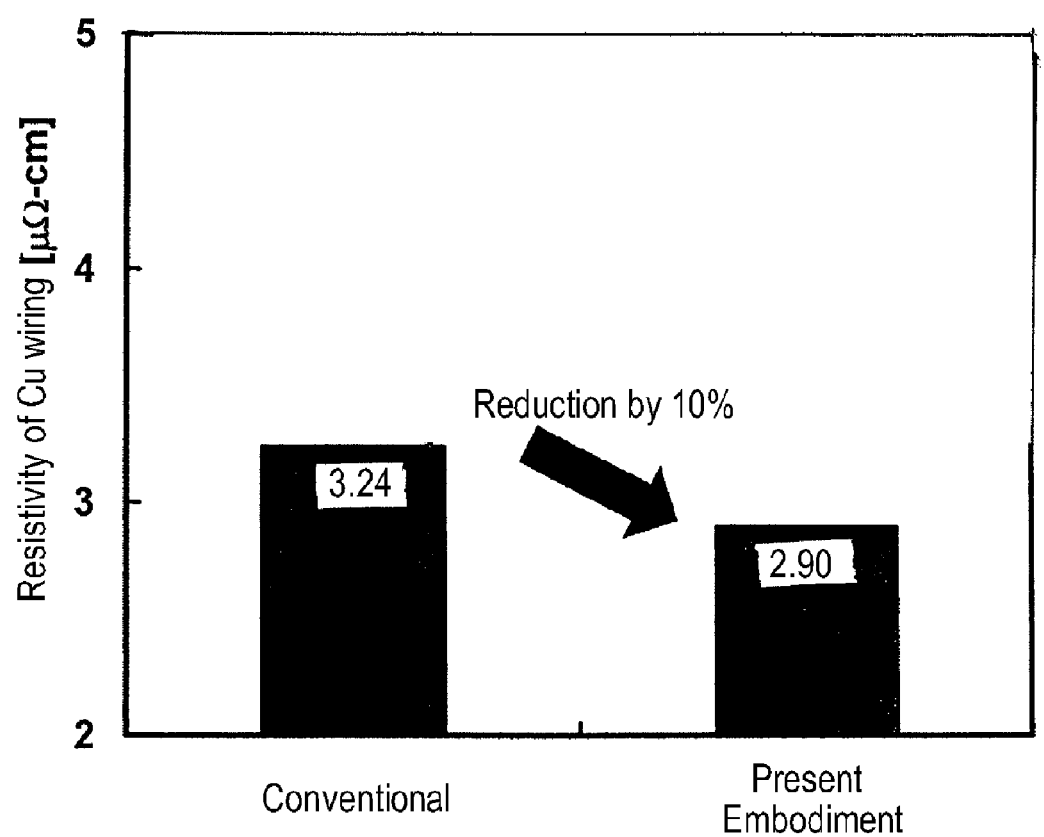
FIG. 29 is a graphical diagram showing measured results of resistivity with respect to a Cu wiring pattern, which is formed by the film-forming method of the second embodiment, and a conventional Cu wiring pattern, which is formed by a conventional film-forming method, which are formed on a wafer having a trench pattern of FIG. 28 with a pattern width of 50 nm.

Next, a Cu wiring pattern was formed on a wafer having a trench pattern of FIG. 28 with a pattern width of 50 nm by forming a barrier film, forming a Ru liner film, forming a first Cu film using iPVD, forming a second Cu film using iPVD, annealing the resultant structure, and performing a CMP process on the resultant structure according to the film-forming method of the second embodiment. Then, resistivity was measured using the resultant Cu wiring pattern. Similarly, the measurement was taken of the resistivity of a conventional Cu wiring pattern, which was formed on the same trench pattern by forming a barrier film and a Cu seed film, embedding Cu in the resultant trench pattern with Cu plating, annealing the resultant structure, and performing a CMP process on the resultant structure. The results are shown in FIG. 29. From this figure, it could be seen that the Cu wiring formed using a dry process had reduced resistivity by 10% when compared to the conventional Cu wiring.

Figure 30A:
FIGS. 30A and 30B are TEM photographs showing Cu crystals with respect to a conventional Cu wiring, which is formed in a trench by a conventional film-forming method, and a Cu wiring, which is formed in a trench by the film-forming method of the second embodiment, which photographs are taken by cutting the Cu wiring after CMP at the center portion of the trench along a longitudinal direction.
Figure 30B:

Next, a Cu wiring was formed by forming a barrier film, forming a Ru liner film, forming a first Cu film using iPVD, and forming a second Cu film using iPVD with respect to the trench, and annealing and performing CMP on the resultant structure according to the second embodiment. The resultant Cu wiring was cut in a longitudinal direction at a portion to correspond to the center of the trench, and a resultant Cu crystal was observed using a TEM. Similarly, a Cu crystal of a conventional Cu wiring, which was formed by forming a barrier film and a Cu seed film, embedding Cu with Cu plating and annealing the resultant structure, was also observed. FIG. 30A is a TEM photograph showing the Cu crystal of the conventional Cu wiring, and FIG. 30B is a TEM photograph showing the Cu crystal of the Cu wiring of the second embodiment which was formed by a dry process. From the figures, it could be seen that an average grain size varied from 67 nm (conventional Cu wiring) to 109 nm (second embodiment using the dry process), thereby obtaining an increase in grain size by 1.6 times the conventional grain size owing to using the dry process. Since the resistivity of a wiring tends to decrease as the grain size increases, it could be seen that the Cu wiring formed using the dry process according to the second embodiment had reduced resistance.

<Other Applications>

While the present disclosure has described exemplary embodiments, the present disclosure is not limited thereto, but may be modified in a variety of forms. For example, while the embodiment describes the ICP type plasma sputtering apparatus being employed for embedment of Cu, the present disclosure is not limited thereto, but may employ other plasma sputtering apparatuses, or other PVD apparatuses if they can control introduction of Cu ions and plasma-generating gas ions.

In addition, the film-forming system is not limited to those shown in FIGS. 1 and 15, but may use a film-forming system in which all film-forming units are connected to a single carrier unit. Further, instead of the multi-chamber type system shown in FIGS. 1 and 15, a system having separate units may be used to form a barrier film, a Ru liner film, and a Cu film, respectively.

Furthermore, while the present disclosure illustrates the embodiments in which the present methods are adapted to a wafer having a trench and a via (hole), the present disclosure can of course be adapted to a wafer having only a trench or only a hole. Moreover, the present disclosure can be used for embedment in devices having variety of structures such as a single damascene structure, a double damascene structure, a 3D mounting structure, or the like. In addition, while the embodiment exemplifies a semiconductor substrate as a target substrate, the silicon wafer may use a silicon wafer and a compound wafer including such as GaAs, SiC, GaN, etc., and instead of the semiconductor wafer, the present disclosure may of course be adapted to a glass substrate used for a Flat Panel Display (FPD) such as an LCD, a ceramic substrate, or the like.

The purpose of the present invention may be achieved by providing a computer (e.g., a controller) with a storage medium storing program codes of software realizing the operations of the present embodiment and allowing a CPU to read and execute the program codes stored in the storage medium.

In this case, the codes themselves read from the storage medium realizes the functions of the aforementioned embodiment, and thus the present invention includes the program codes and the storage medium storing the program codes The storage medium for providing the program codes may be, e.g., a RAM, an NV-RAM, a floppy disk, a hard disk, a magneto-optical disk, an optical disk such as CD-ROM, CD-R, CD-RW, and DVD (DVD-ROM, DVD-RAM, DVD-RW, and DVD-RW), a magnetic tape, a nonvolatile memory card, or other types of ROM capable of storing the program codes. The program codes may be provided to the computer by being downloaded from another computer or a database, which is not shown, connected to the Internet, a commercial use network, a local area network, or the like.

The operations of the aforementioned embodiment can be realized by executing the program codes read by the computer or by the actual processing partially or wholly executed by an OS operated on the CPU according to the instructions of the program codes.

In addition, the operations may also be realized by the actual processing partially or wholly executed by a CPU or the like in a built-in function extension board or an external function extension unit of a computer according to the instructions of program codes read from a storage medium after the program codes are inputted into a memory in the built-in function extension board or the external function extension unit. The program codes may be object codes, program codes executed by an interpreter, script data provided to an operating system, or the like.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a Cu wiring by embedding Cu in a trench or hole having a predetermined pattern formed in a substrate, the method comprising:
   at least forming a barrier film on the surface of the trench or hole;
   forming a Ru film on the barrier film;
   embedding Cu in the trench or hole by forming a first Cu film on the Ru film using PVD such that migration of copper into the trench or hole occurs;
   forming a second Cu film on a pattern including the first Cu film using PVD at a film-forming rate faster than that of the first Cu film; and
   performing chemical mechanical polishing (CMP) on the entire surface of the substrate.

2. The method of claim 1, further comprising an annealing process between the process of forming the second Cu film and the process of performing CMP.

3. The method of claim 1, wherein the process of embedding Cu in the trench or hole by forming the first Cu film is performed by an apparatus generating plasma using plasma-generating gas in a process chamber in which the substrate is loaded, allowing Cu elements to be emitted from a Cu target, ionizing the Cu elements in the plasma into Cu ions, and applying a bias power to the substrate to cause the Cu ions to be attracted towards the substrate.

4. The method of claim 3, wherein the process of embedding Cu in the trench or hole by forming the first Cu film is carried out at a temperature of the substrate ranging between 65° C. and 350° C.

5. The method of claim 3, wherein the process of forming the second Cu film is carried out by the apparatus for forming the first Cu film under a condition that at least one of a pressure of the process chamber and a temperature of the substrate becomes lower than the condition when the first Cu film is formed.

6. The method of claim 3, wherein the process of forming the second Cu film is carried out by an apparatus different from the apparatus for forming the first Cu film.

7. The method of claim 6, wherein the process of forming the second Cu film is performed by an apparatus generating plasma using plasma-generating gas in a process chamber in which the substrate is loaded, allowing Cu elements to be emitted from a Cu target, ionizing the Cu elements in the plasma into Cu ions, and applying a bias power to the substrate to cause the Cu ions to be attracted towards the substrate under a condition that at least one of a pressure of the process chamber and a temperature of the substrate becomes lower than the condition of the apparatus for forming the first Cu film.

8. The method of claim 1, wherein the first Cu film is formed to fill the whole of the trench or hole, and the second Cu film is formed as overburden on the first Cu film.

9. The method of claim 1, wherein the pattern has a relatively narrow trench or hole and a relatively wide trench or hole, wherein the first Cu film completely fills the relatively narrow trench or hole and partially fills the relatively wide trench or hole, and wherein the second Cu film is formed as overburden on the first Cu film in the relatively narrow trench or hole and completely fills the relatively wide trench or hole, thereby further forming a overburdened portion.

10. The method of claim 1, wherein the barrier film is formed of a film selected from a group including a Ti film, a TiN film, a Ta film, a TaN film, a Ta/TaN film, a TaCN film, a W film, a WN film, a WCN film, a Zr film, a ZrN film, a V film, a VN film, a Nb film, and a NbN film.

11. The method of claim 1, wherein the barrier film is formed by PVD.

12. The method of claim 1, wherein the Ru film is formed by CVD.

13. The method of claim 12, wherein the Ru film is formed by CVD using ruthenium carbonyl as a film-forming material.

* * * * *